(12) United States Patent
Cui et al.

(10) Patent No.: US 11,843,860 B2
(45) Date of Patent: *Dec. 12, 2023

(54) METHODS AND APPARATUS EMPLOYING A PHASE DETECTION AUTOFOCUS (PDAF) OPTICAL SYSTEM

(71) Applicant: QUALCOMM Incorporated, San Diego, CA (US)

(72) Inventors: Nan Cui, San Diego, CA (US);
Zuguang Xiao, San Diego, CA (US);
Wenbin Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/049,601

(22) Filed: Oct. 25, 2022

(65) Prior Publication Data
US 2023/0141949 A1 May 11, 2023

Related U.S. Application Data

(63) Continuation of application No. 16/859,821, filed on Apr. 27, 2020, now Pat. No. 11,516,378.

(51) Int. Cl.
*H04N 23/67* (2023.01)
*G02B 7/34* (2021.01)

(52) U.S. Cl.
CPC ............. *H04N 23/672* (2023.01); *G02B 7/34* (2013.01)

(58) Field of Classification Search
None
See application file for complete search history.

(56) References Cited

U.S. PATENT DOCUMENTS 11,516,378 B2 * 11/2022 Cui ..................... H04N 25/704
2005/0231628 A1    10/2005 Kawaguchi et al.
(Continued)

FOREIGN PATENT DOCUMENTS

GB         2516486 A       1/2015
JP     2000155257 A        6/2000
(Continued)

OTHER PUBLICATIONS

International Search Report and Written Opinion—PCT/US2021/023743—ISA/EPO—dated Jul. 1, 2021.

*Primary Examiner* — Cynthia Segura
(74) *Attorney, Agent, or Firm* — Procopio, Cory, Hargreaves & Savitch LLP/Qualcomm Incorporated

(57) ABSTRACT

Apparatus and methods employing a PDAF optical system are disclosed herein. An example apparatus includes an image sensor comprising a plurality of pixels. The plurality of pixels include a set of pixels configurable to be imaging pixels or focus pixels. The image sensor is configured to generate image data of a scene based on received light at the plurality of pixels. The example apparatus also includes a processor coupled to the image sensor. The processor may be configured to receive first image data of a first frame of the scene, determine at least one region of interest or region of non-interest of the first frame, select, based on the determined at least one region of interest or region of non-interest, a subset of the set of pixels to be focus pixels, and cause the selected subset of the set of pixels to operate as focus pixels.

19 Claims, 15 Drawing Sheets

(56) References Cited

U.S. PATENT DOCUMENTS

| | | |
|---|---|---|
| 2006/0029284 A1 | 2/2006 | Stewart |
| 2008/0158407 A1 | 7/2008 | Funamoto |
| 2008/0309771 A1* | 12/2008 | Takahashi ............... G02B 7/34 |
| | | 348/208.4 |
| 2009/0128671 A1* | 5/2009 | Kusaka ............... H04N 25/704 |
| | | 348/246 |
| 2014/0285627 A1 | 9/2014 | Kuboi |
| 2014/0300805 A1 | 10/2014 | Davis et al. |
| 2014/0347532 A1* | 11/2014 | Kang ................ H04N 25/704 |
| | | 348/294 |
| 2015/0163434 A1* | 6/2015 | Ishibashi ............. H04N 25/704 |
| | | 348/66 |
| 2015/0373250 A1 | 12/2015 | Sfaradi et al. |
| 2016/0182806 A1* | 6/2016 | Liu ..................... H04N 23/673 |
| | | 348/349 |
| 2016/0241772 A1 | 8/2016 | Johnson |
| 2017/0302844 A1* | 10/2017 | Nakamoto ........ H01L 27/14643 |
| 2018/0220058 A1 | 8/2018 | Takahashi |
| 2019/0289219 A1 | 9/2019 | Yamazaki et al. |
| 2020/0162673 A1 | 5/2020 | Kanda et al. |
| 2020/0310178 A1 | 10/2020 | Zhou et al. |
| 2020/0412966 A1* | 12/2020 | Kikuchi ................ H04N 25/46 |
| 2021/0208482 A1* | 7/2021 | Galor Gluskin ..... G02B 3/0056 |
| 2021/0211580 A1* | 7/2021 | Galor Gluskin ......... G02B 7/34 |
| 2021/0258473 A1* | 8/2021 | Yoshimura ........... H04N 23/633 |

FOREIGN PATENT DOCUMENTS

| | | |
|---|---|---|
| JP | 2014102478 A | 6/2014 |
| JP | 2014135452 A | 7/2014 |

\* cited by examiner

METHODS AND APPARATUS EMPLOYING A PHASE DETECTION AUTOFOCUS (PDAF) OPTICAL SYSTEM

CROSS REFERENCE TO RELATED APPLICATION(S)

This application is a Continuation of U.S. Non-provisional application Ser. No. 16/859,821, entitled "METHODS AND APPARATUS EMPLOYING A PHASE DETECTION AUTOFOCUS (PDAF) OPTICAL SYSTEM" and filed on Apr. 27, 2020, which is expressly incorporated by reference herein in its entirety.

BACKGROUND

Technical Field

The present disclosure relates generally to phase detection autofocus (PDAF), and more particularly, to methods and apparatus employing a PDAF optical system.

INTRODUCTION

Image capture devices, such as digital cameras and mobile devices (e.g., smartphones, tablets, laptops, etc.) include an imaging system that includes an image sensor positioned downstream of one or more optical components. Typical optical components may include one or more lenses and apertures. The optical components direct light of a scene onto the image sensor. A processor processes the data captured by the image sensor to record an image. To record a clear image, the optical components focus light from the scene onto the image sensor. If the light is out of focus at the plane of the image sensor, then the image sensor may capture a blurry image.

Some image capture devices use phase detection autofocus (PDAF) pixels to perform autofocus. Image capture devices may include an image sensor including an array of pixels. The array of pixels may include one or more imaging pixels and one or more focus pixels (also referred to as "phase detection pixels") arranged in a pattern. There is currently a need to improve autofocus technology, including techniques implemented with a combined image sensor (e.g., an image sensor including imaging pixels and focus pixels).

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. An example apparatus comprises an image sensor and a processor coupled to the image sensor. The example image sensor may include a plurality of pixels including a set of pixels configurable to be imaging pixels or focus pixels. The example image sensor may be configured to generate first image data of a scene based on received light at the plurality of pixels. The example processor may be configured to receive the first image data of a first frame of the scene. The example processor may be configured to determine at least one region of interest or region of non-interest of the first frame. The example processor may be configured to select, based on the determined at least one region of interest or region of non-interest, a subset of the set of configurable pixels to be focus pixels. The example processor may be configured to cause the selected subset of the set of configurable pixels to operate as focus pixels.

In another aspect, disclosed techniques include a method of operation for autofocus. The example method includes receiving, from an image sensor, first image data of a first frame of a scene. In some examples, the image sensor may include a plurality of pixels, the plurality of pixels including a set of pixels configurable to be imaging pixels or focus pixels. In some examples, the image sensor may be configured to generate the first image data of the scene based on received light at the plurality of pixels. The example method also includes determining at least one region of interest or region of non-interest of the first frame. Additionally, the example method includes selecting, based on the determined at least one region of interest or region of non-interest, a subset of the set of configurable pixels to be focus pixels. Further, the example method includes causing the selected subset of the set of configurable pixels to operate as focus pixels.

In another aspect, disclosed techniques include an apparatus for performing autofocus. The example apparatus includes means for receiving, from an image sensor, first image data of a first frame of a scene. In some examples, the image sensor may include a plurality of pixels, the plurality of pixels including a set of pixels configurable to be imaging pixels or focus pixels. In some examples, the image sensor may be configured to generate the first image data of the scene based on received light at the plurality of pixels. The example apparatus also includes means for determining at least one region of interest or region of non-interest of the first frame. Additionally, the example apparatus includes means for selecting, based on the determined at least one region of interest or region of non-interest, a subset of the set of configurable pixels to be focus pixels. Further, the example apparatus includes means causing the selected subset of the set of configurable pixels to operate as focus pixels.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
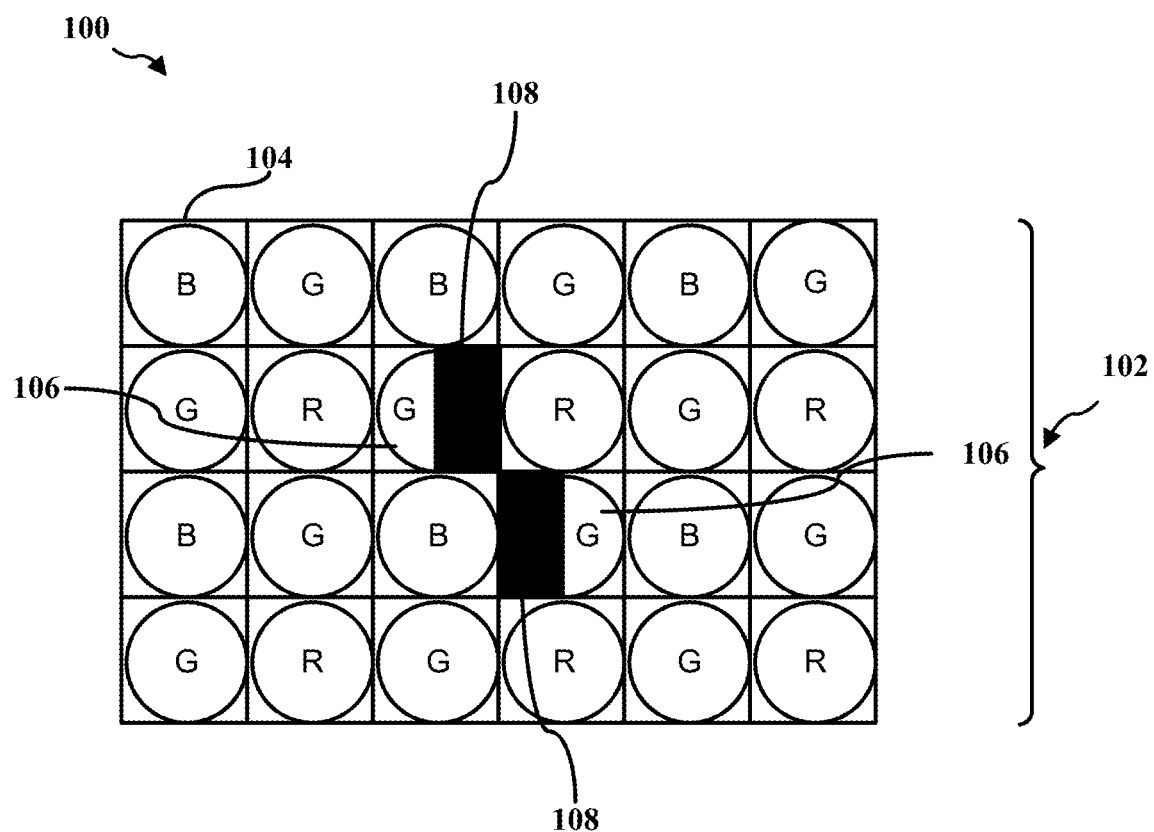
FIG. 1 illustrates an example image sensor including sparse focus pixels that may be used to perform PDAF.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Various aspects of systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the systems, apparatuses, computer program products, and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different wireless technologies, system configurations, networks, and transmission protocols, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors (which may also be referred to as processing units). Examples of processors include microprocessors, microcontrollers, graphics processing units (GPUs), general purpose GPUs (GPGPUs), central processing units (CPUs), application processors, image signal processors (ISPs), digital signal processors (DSPs), reduced instruction set computing (RISC) processors, systems-on-chip (SOC), baseband processors, application specific integrated circuits (ASICs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software can be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise. The term application may refer to software. As described herein, one or more techniques may refer to an application, i.e., software, being configured to perform one or more functions. In such examples, the application may be stored on a memory, e.g., on-chip memory of a processor, system memory, or any other memory. Hardware described herein, such as a processor, may be configured to execute the application. For example, the application may be described as including code that, when executed by the hardware, causes the hardware to perform one or more techniques described herein. As an example, the hardware may access the code from a memory and execute the code accessed from the memory to perform one or more techniques described herein. In some examples, components are identified in this disclosure. In such examples, the components may be hardware, software, or a combination thereof. The components may be separate components or sub-components of a single component.

Accordingly, in one or more examples described herein, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

Phase detection autofocus (PDAF) techniques are based on measuring the offset (or phase difference) between two images that were generated with different asymmetric optical apertures. The magnitude and sign of the calculated phase may be correlated with an amount of defocus, which may be used to estimate the lens displacement needed for optimal focus.

There are many different types of focus pixel patterns and/or arrangements that may be included in an image sensor. FIG. 1 illustrates an example image sensor 100 including sparse focus pixels that may be used to perform PDAF. An array 102 of pixels 104 may include one or more focus pixels 106 that are shielded (e.g., using metal shielding) that may be used to create left or right images used in PDAF. For example, in some examples using sparse PDAF with metal shielding, one to three percent of the pixels 104 may be dedicated to left/right PDAF. On each of the focus pixels 106, a metal shield 108 may be positioned between a photodiode and a microlens (sometimes referred to as a "u-lens," an "on-chip lens," or "OCL") that creates an effective asymmetric aperture by blocking light at certain interception angles, allowing for the capture of left or right image information for PDAF purposes. The microlens may be used to increase the sensitivity of the underlying photodiode towards light. For imaging purposes, the values of the focus pixels 106 may be replaced by an interpolated value of the surrounding pixels, similar to how defective pixels may be corrected.

It should be appreciated that while the above description of the image sensor 100 includes left and right pairs of focus pixels, in other examples, the image sensor 100 may additionally or alternatively include up and down pairs of focus pixels. For example, the mask or metal shielding of focus pixels may mask top and bottom portions of the respective focus pixels, which may generate up and down (or top and bottom) pairs of images.

In some examples, the focus pixels may include dual photodiode (2PD) pixels where each focus pixel includes two diodes (e.g., a first photodiode and a second photodiode adjacent to the first photodiode). In some examples, the image sensor 100 may include one or more 2PD focus pixels including a left diode and a right diode. In some such examples, the left diode may generate a left image and the right diode may generate a right image. In some examples, the image sensor 100 may include all 2PD focus pixels (e.g., without any imaging pixels including a single photodiode). In some examples, the image sensor 100 may include sparse 2PD focus pixels. For example, the image sensor 100 may include a pixel array including a first subset of imaging pixels including a single photodiode and a second subset of 2PD focus pixels. In some such examples, the 2PD focus pixels may be arranged in any manner (e.g., adjacent to one another, spaced apart from one another, etc.). In some examples, the focus pixels of the pixel array of the image sensor 100 may be left-right pairs of focus pixels or up-down pairs of focus pixels. In some examples, the image sensor 100 may include a combination of left-right pairs of focus pixels and up-down pairs of focus pixels.

In some examples, the image sensor 100 may include 4PD focus pixels where each focus pixel includes four photodiodes (sometimes referred to as "quad-PD" or QPD" pixels). In some such examples, the 4PD focus pixels may generate two pairs of images (e.g., a pair of left-right images and a pair of up-down images).

In some examples, the image sensor 100 may include all 4PD focus pixels (e.g., without any imaging pixels including a single photodiode). In some examples, the image sensor 100 may include sparse 4PD focus pixels such that a subset of the focus pixels of the pixel array of the image sensor 100 are 4PD focus pixels arranged in any manner (e.g., adjacent to one another, spaced apart from one another, etc.). In some such examples, one or more remaining pixels of the pixel array may be imaging pixels and/or 2PD focus pixels.

Once pairs of images have been generated for each focus pixel (e.g., a pair of left-right images and/or a pair of up-down images), the images may be compared with one another. For example, phase differences between signals generated from the left focus pixels (e.g., the left image) and the right focus pixels (e.g., the right image) may be compared and an offset (e.g., a phase disparity) between the signals may be determined. The offset may be used to estimate the lens displacement needed for optimal focus.

While different image sensors may utilize different patterns and/or arrangements of focus pixels, it should be appreciated that the distribution of such focus pixels within the image sensor is fixed. As a result, the density of focus pixels providing focus data (or "phase information") for PDAF purposes associated with a region of interest in an image is also fixed. However, for some regions of interest (ROIs) in an image (e.g., a face, food, and other ROIs that people consider as "more important"), the density of corresponding focus pixels may be too low to provide accurate focus data. For other ROIs (e.g., the sky, wall, and other ROIs that people consider of "low importance"), the density of focus pixels within the image sensor that are associated with the ROI may be too high and may lead to a waste of information.

In some examples, the fixed focus orientation (e.g., left-right or up-down) of the focus pixels may result in textures or edges of an image being undetected. For example, focus data provided by focus pixels with a left-right focus orientation may be unable to detect a horizontal texture within a region of interest. In some examples, if a region of interest includes an area of non-interest, such as a saturated area, focus data provided by focus pixels corresponding to the area of non-interest may not provide useful information. In some examples, the fixed pattern and/or arrangement of focus pixels may result in artifacts when de-noising techniques are applied.

In general, example techniques disclosed herein are directed to adjusting focus pixels of an image sensor based on an analysis of a scene. For example, disclosed techniques utilize an image sensor having a plurality of pixels including a set of pixels configurable to operate as focus pixels or imaging pixels. For example, a configurable pixel may include a photodiode and an opacity transitioning material positioned above the photodiode. The opacity transitioning material may include a first opacity transitioning material portion arranged above a first section of the photodiode and a second opacity transitioning material portion arranged above a second section of the photodiode, and where the first opacity transitioning material portion and the second opacity transitioning material portion are independently configurable to be opaque or transparent. In some such examples, the configurable pixel may be configured to operate as a focus pixel when one of the first opacity transitioning material portion or the second opacity transitioning material portion is opaque and the other opacity transitioning material portion is transparent. The configurable pixel may be configured to operate as an imaging pixel when both opacity transitioning material portions are transparent.

When the configurable pixel is configured to operate as an imaging pixel, the respective imaging pixel generates imaging data that may be used to capture the scene. When the configurable pixel is configured to operate as a focus pixel, the respective focus pixel generates focus data that may be used to perform autofocusing. In some examples, when the configurable pixel is configured to operate as a focus pixel, the respective focus pixel may be configured with a focus orientation. As described above, focus pixels may be arranged in a left-right pattern where a first focus pixel may operate as a left focus pixel and a second focus pixel may operate as a right focus pixel. In other examples, focus pixels may be arranged in an up-down pattern where a first focus pixel may operate as an upper focus pixel and a second focus pixel may operate as a lower focus pixel.

In some examples, a configurable pixel may be dynamically adjusted to operate as an imaging pixel or as a focus pixel based on an analysis of a scene. For example, disclosed techniques may set a configurable pixel to operate as an imaging pixel for a first frame of a scene and may set the configurable pixel to operate as a focus pixel for a subsequent frame of the scene. In some examples, disclosed techniques may set a first focus orientation for a configurable pixel operating as a focus pixel for a frame and may set a second focus orientation for the configurable pixel for a subsequent frame of the scene.

Example techniques disclosed herein include receiving, at a processor, first image data from an image sensor coupled to the processor and determining at least one region of interest or region of non-interest based on the first image data. As used herein, a "region of interest" or a "region of non-interest" may be generally referred to as an "identified region." Disclosed techniques may then apply one or more scene analysis techniques on the first image data and identified region(s) to determine how to adjust pixel configurations of the image sensor. Disclosed techniques may then adjust a density of focus pixels within the image sensor that are associated with an identified region based on the determined pixel configurations. For example, disclosed techniques may increase or decrease the quantity of focus pixels associated with the identified region to adjust the density of focus pixels within the image sensor.

In some examples, the one or more scene analysis techniques may include performing object detection and/or recognition techniques. For example, disclosed techniques may process the first image data and detect and/or recognize one or more objects within an identified region. In some examples, disclosed techniques may increase the density of focus pixels within the image sensor that are associated with the identified region based on the detected and/or recognized object. In some examples, disclosed techniques may additionally or alternatively decrease the density of focus pixels within the image sensor that are associated with the identified region based on the detected and/or recognized object. For example, a scene may include a first identified region including a face, a second identified region including a microphone, and a third identified region including a cup. In some examples, disclosed techniques may set the density of focus pixels associated with the first identified region to a first density level, may set the density of focus pixels associated with the second identified region to a second density level that is less dense than the first density level, and may set the density of focus pixels associated with the third identified region to a third density level that is less than the first density level and the second density level. In some examples, the first density level and the second density level may correspond to increasing the density of focus pixels within the image sensor that are associated with respective identified regions and the third density level may correspond to decreasing the density of focus pixels within the image sensor that are associated with the third identified region.

In some examples, disclosed techniques may perform focus data orientation detection techniques based on an analysis of a scene. For example, in some instances, textures or edges within a region of interest may be oriented in a particular direction, such as a horizontal direction or a vertical direction. Moreover, the corresponding focus pixels associated with the region of interest may be configured in a focus orientation such that the texture or edge may not be detected by the generated focus data. For example, focus pixels arranged with a left-right focus orientation may not detect a horizontal texture as the phase detection (PD) analysis of the focus data may be unable to determine an offset between the left image and the right image generated by the left focus pixels and the right focus pixels, respectively.

Example techniques disclosed herein set a first (or default) focus orientation for the focus pixels within the image sensor that are associated with a region of interest. Disclosed techniques then perform a PD analysis on image data generated by the image sensor while the focus pixels are set in the first focus orientation. If a confidence level output by the PD analysis does not satisfy a confidence threshold, disclosed techniques may then set a second focus orientation for the focus pixels associated with the region of interest, where the second focus orientation is different than the first focus orientation. For example, disclosed techniques may change the focus orientation of focus pixels associated with an identified region from a left-right focus orientation to an up-down focus orientation. However, if the confidence level satisfies the confidence threshold, disclosed techniques may then maintain the first focus orientation of the focus pixels. It should be appreciated that in some examples, the focus pixels associated with different regions of interests may be associated with different respective focus orientations. Additionally, it should be appreciated that in some examples, the respective focus orientation of individual focus pixels associated with a region of interest may vary.

The confidence level indicates the likelihood that the focus value computed for the image is correct. The confidence level (sometimes referred to as a "confidence measurement") can be determined based on a spectral analysis of the image data corresponding to an edge, for example. Sharper edges have high contrast between adjacent pixels, and the spectral analysis shows that sharper edges have non-zero coefficients for higher order frequency components. The confidence level in an image as a function of focal length generally tracks the focus value as a function of focal length (lens position). The confidence level often has a peak at the focal length where the image is in focus, and falls off rapidly as the lens position moves away from the focused position. Low light levels or the presence of high-frequency patterns (e.g., closely spaced parallel lines) can reduce the confidence level for a focus value. When the image is severely out of focus, autofocus can select a lens position having a local maximum contrast value, so the confidence level is low. In most circumstances, with adequate lighting the confidence level has a peak value when the focus value is accurate. The confidence value can be based on a variety of statistical measures such as mean, variance, standard deviation or other measures. In one example, if statistical analysis reveals that selected lens positions for the near or far focus bound include lens positions situated at substantial distances from one another, the confidence value may be low.

In some examples, disclosed techniques may perform saturation detection techniques based on an analysis of a scene. For example, in some instances, a region of interest may include one or more saturated areas. As used herein, an area is saturated when the digital value output by the image sensor for the corresponding pixels is greater than a saturation threshold. In some examples, the saturation threshold may be a predetermined value. In some examples, the saturation threshold may be a percentage. Information provided by focus pixels corresponding to the saturated area may not be beneficial for autofocusing purposes as the provided information may not be used for comparing images and determining an offset. Example techniques disclosed herein provide techniques for identifying a saturated area within an area of interest. Example techniques may then set the density of focus pixels within the image sensor that are corresponding to the saturated area to a first density level and may set the density of focus pixels that are corresponding to the remaining area of the region of interest to a second density level that is greater than the first density level. In some examples, disclosed techniques may set the first density level to zero such that the configurable pixels corresponding to the saturated area are configured to operate as imaging pixels.

In some examples, disclosed techniques may perform edge detection techniques based on an analysis of a scene. In low-light environments, the image data generated by the image sensor may include a low signal-to-noise ratio (SNR) and/or high noise. To improve the quality of such images, some examples apply de-noising techniques to the generated image data. For example, for a selected pixel, binning includes averaging the value of two or more nearby pixels (referred to collectively herein as "binning pixels") and using the averaged value as the value for the selected pixel. However, in some examples, an edge may extend between the binning pixels. For example, a region of interest may include a screen of a monitor (e.g., a first object) and a chassis of the monitor (e.g., a second object). As used herein, an "edge" refers to the boundary created by two or more objects (e.g., the boundary between the screen of the monitor and the chassis of the monitor). In some such examples, the binning pixels may include a pixel at a location corresponding to the first object and a pixel at a location corresponding to the second object (e.g., pixels corresponding to different objects). Binning or averaging the values of these pixels may skew the average value for a selected pixel, resulting in an artifact and/or an incorrect representation of the image.

Example techniques disclosed herein may apply edge detection techniques to detect an edge within a region of interest. If an edge is detected, disclosed techniques may then partition the region of interest and corresponding pixels based on the detected edge. Example techniques may then increase the quantity of focus pixels within the image sensor that are associated with the respective region of interest portions. By increasing the quantity of focus pixels associated with the respective regions of interest portions, disclosed techniques may facilitate using the focus pixels associated with the respective region of interest portions to perform binning for same respective objects, thereby reducing (or avoiding) the performing of binning of focus pixels across the edge and for two or more objects.

Figure 2:
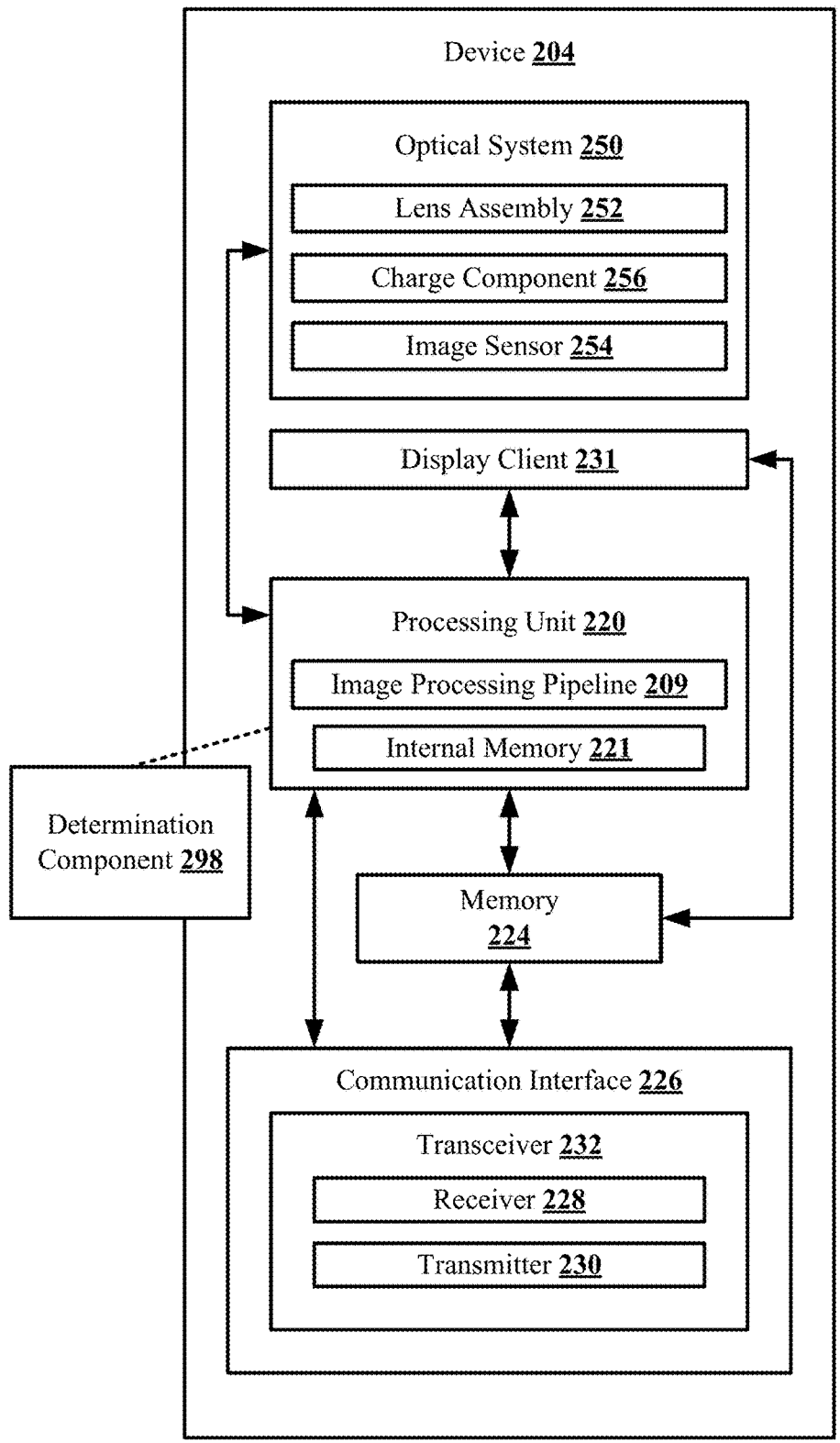
FIG. 2 is a block diagram that illustrates an example content generation system, in accordance with one or more techniques of this disclosure.

FIG. 2 is a block diagram that illustrates an example content generation system 200 configured to implement one or more techniques of this disclosure. The content generation system 200 includes a device 204. As described herein, a device, such as the device 204, may refer to any device, apparatus, or system configured to perform one or more techniques described herein. For example, a device may be a server, a base station, user equipment, a client device, a station, an access point, a computer (e.g., a personal computer, a desktop computer, a laptop computer, a tablet computer, a computer workstation, or a mainframe computer), an end product, an apparatus, a phone, a smart phone, a server, a video game platform or console, a handheld device (e.g., a portable video game device or a personal digital assistant (PDA)), a wearable computing device (e.g., a smart watch, an augmented reality device, or a virtual reality device), a non-wearable device, a display or display device, a television, a television set-top box, an intermediate network device, a digital media player, a video streaming device, a content streaming device, an in-car computer, any mobile device, any device configured to generate graphical content, or any device configured to perform one or more techniques described herein. Processes herein may be described as performed by a particular component (e.g., an ISP), but, in further embodiments, can be performed using other components (e.g., an application processor or a CPU), consistent with disclosed embodiments.

The device 204 may include one or more components or circuits for performing various functions described herein. In some examples, one or more components of the device 204 may be components of an SOC. The device 204 may include one or more components configured to perform one or more techniques of this disclosure. In the example shown, the device 204 includes a processing unit 220, a memory 224, and an optical system 250. In some examples, the device 204 can include a number of additional or alternative components, such as a communication interface 226, a transceiver 232, a receiver 228, a transmitter 230, and a display client 231.

In the illustrated example, the processing unit 220 includes an internal memory 221. The processing unit 220 may be configured to perform image processing, such as in image processing pipeline 209. Example implementations of the image processing pipeline 209 may facilitate image capture functions. In some examples, the processing unit 220 may additionally or alternatively be configured to perform graphics processing, such as in a graphics processing pipeline and/or non-graphics processing, such as in a compute processing pipeline. Example implementations of the compute processing pipeline may facilitate performing general-purpose operations or non-graphical operations, such as machine learning operations and/or artificial intelligence operations.

In some examples, the processing unit 220 includes an ISP (or application processor) configured to implement the image processing pipeline 209. The ISP may facilitate controlling image capture functions, such as autofocus, auto-white balance, and/or auto-exposure. In some examples, the ISP may also facilitate performing post-processing functions, such as depth mapping and/or Bokeh effect. In some examples, the ISP may also facilitate performing cropping, scaling (e.g., to a different resolution), image stitching, image format conversion, color interpolation, color processing, image filtering (e.g., spatial image filtering), lens artifact or defect correction, sharpening, or the like.

In some examples, the processing unit 220 may include a display processor to perform one or more display processing techniques on one or more frames generated by the processing unit 220 before presentment of the generated frame(s) by the display client 231. For example, the display processor may be configured to perform one or more display processing techniques on one or more frames generated by the processing unit 220. The display processor may output image data to the display client 231 according to an interface protocol, such as, for example, the MIPI DSI (Mobile Industry Processor Interface, Display Serial Interface).

The display client 231 may be configured to display or otherwise present frames processed by the processing unit 220 (and/or the display processor). In some examples, the display client 231 may include one or more of: a liquid crystal display (LCD), a plasma display, an organic light emitting diode (OLED) display, a projection display device, an augmented reality display device, a virtual reality display device, a head-mounted display, or any other type of display device.

Reference to the display client 231 may refer to one or more displays. For example, the display client 231 may include a single display or multiple displays. The display client 231 may include a first display and a second display. In further examples, the results of the image processing may not be displayed on the device. For example, the display(s) may not receive any frames for presentment thereon. Instead, the frames or image processing results may be transferred to another device. In some examples, the transferring of the frames or image processing results to another device can be referred to as split-rendering.

As disclosed above, the display client 231 may be configured in accordance with MIPI DSI standards. The MIPI DSI standards support a video mode and a command mode. In examples in which the display client 231 is operating in the video mode, the processing unit 220 (and/or the display processor) may continuously refresh the graphical content of the display client 231. For example, the entire graphical content of a frame may be refreshed per refresh cycle (e.g., line-by-line).

In examples in which the display client 231 is operating in the command mode, the processing unit 220 (and/or the display processor) may write the graphical content of a frame to a buffer. In some examples, the display client 231 may include the buffer and, thus, the buffer may represent memory local to the display client 231. In some such examples, the processing unit 220 (and/or the display processor) may not continuously refresh the graphical content of the display client 231. Instead, the processing unit 220 (and/or the display processor) may use a vertical synchronization (Vsync) pulse to coordinate rendering and consuming of graphical content at the buffer. For example, when a Vsync pulse is generated, the processing unit 220 (and/or the display processor) may output new graphical content to the buffer. Thus, the generating of the Vsync pulse may indicate when current graphical content at the buffer has been rendered.

Memory external to the processing unit 220, such as memory 224, may be accessible to the processing unit 220, the display client 231, and/or the communication interface 226. For example, the processing unit 220 may be configured to read from and/or write to external memory, such as the memory 224. The processing unit 220, the display client 231, and/or the communication interface 226 may be communicatively coupled to the memory 224 over a bus. In some examples, the processing unit 220, the memory 224, the communication interface 226, and/or the display client 231 may be communicatively coupled to each other over the bus or a different connection.

In some examples, the device 204 may include a content encoder/decoder configured to receive graphical and/or display content from any source, such as the memory 224 and/or the communication interface 226. The memory 224 may be configured to store received encoded content or decoded content. In some examples, the content encoder/decoder may be configured to receive encoded content or decoded content (e.g., from the memory 224 and/or the communication interface 226) in the form of encoded pixel data or decoded pixel data. In some examples, the content encoder/decoder may be configured to encode or decode any content.

The internal memory 221 and/or the memory 224 may include one or more volatile or non-volatile memories or storage devices. In some examples, the internal memory 221 and/or the memory 224 may include RAM, SRAM, DRAM, erasable programmable ROM (EPROM), electrically erasable programmable ROM (EEPROM), flash memory, a magnetic data media or an optical storage media, or any other type of memory.

The internal memory 221 and/or the memory 224 may be a non-transitory storage medium according to some examples. The term "non-transitory" may indicate that the storage medium is not embodied in a carrier wave or a propagated signal. However, the term "non-transitory" should not be interpreted to mean that the internal memory 221 and/or the memory 224 is non-movable or that its contents are static. As one example, the memory 224 may be removed from the device 204 and moved to another device. As another example, the memory 224 may not be removable from the device 204.

The processing unit 220 may be a CPU, an application processor, an ISP, a GPU, a general purpose GPU (GPGPU), a DPU, a display processor, or any other processing unit that may be configured to perform image processing. In some examples, the processing unit 220 may be integrated into a motherboard of the device 204. In some examples, the processing unit 220 may be present on a graphics card that is installed in a port in a motherboard of the device 204, or may be otherwise incorporated within a peripheral device configured to interoperate with the device 204. The processing unit 220 may include one or more processors, such as one or more microprocessors, CPUs, application processors, GPUs, DPUs, display processors, ISPs, application specific integrated circuits (ASICs), field programmable gate arrays (FPGAs), arithmetic logic units (ALUs), digital signal processors (DSPs), discrete logic, software, hardware, firmware, other equivalent integrated or discrete logic circuitry, or any combinations thereof. If the techniques are implemented partially in software, the processing unit 220 may store instructions for the software in a suitable, non-transitory computer-readable storage medium (e.g., the internal memory 221), and may execute the instructions in hardware using one or more processors to perform the techniques of this disclosure. Any of the foregoing, including hardware, software, a combination of hardware and software, etc., may be considered to be one or more processors.

In the illustrated example, the device 204 includes a communication interface 226. The communication interface 226 may include a receiver 228 and a transmitter 230. The receiver 228 may be configured to perform any receiving function described herein with respect to the device 204.

Additionally, the receiver 228 may be configured to receive information (e.g., eye or head position information, rendering commands, or location information) from another device. The transmitter 230 may be configured to perform any transmitting function described herein with respect to the device 204. For example, the transmitter 230 may be configured to transmit information to another device, which may include a request for content. The receiver 228 and the transmitter 230 may be combined into a transceiver 232. In such examples, the transceiver 232 may be configured to perform any receiving function and/or transmitting function described herein with respect to the device 204.

In the illustrated example, the device 204 includes the optical system 250 in communication with the processing unit 220. The optical system 250 includes a lens assembly 252, an image sensor 254, and a charge component 256. The lens assembly 252 may facilitate focusing incoming light onto the pixels of the image sensor 254. It should be appreciated that the lens assembly 252 may include any number of optical elements. In some examples, the processing unit 220 may be configured to shift the lens assembly 252 to adjust the focus of the light received on the image sensor 254. It should be appreciated that the optical system 250 may include one or more additional optical components mounted inside a housing of the device 204 and/or positioned on the housing or the lens assembly 252. For example, the additional optical components may include a motion sensor (e.g., an accelerometer, a gyroscope, etc.), apertures, shutters, mirrors, filters, coatings, etc.

The example image sensor 254 may be a complementary metal oxide semiconductor (CMOS) imaging sensor or a charge-coupled device (CCD) sensor. However, it should be appreciated that in other examples, the image sensor may be any suitable sensor including pixels for capturing image data. The example image sensor 254 of FIG. 2 includes a plurality of pixels for capturing image data. The image sensor 254 may be configured to digitize the amount of light received by each pixel. For example, when the received light is expressed as a ten-bit digital value, a low value (e.g., 100) may indicate a low amount of light, and a high value (e.g., 1023) may indicate a high amount of light. The plurality of pixels may also include a set of pixels that are configurable to operate as focus pixels or imaging pixels. In some examples, the set of configurable pixels may comprise one to all of the plurality of pixels of the image sensor 254.

Figure 3:
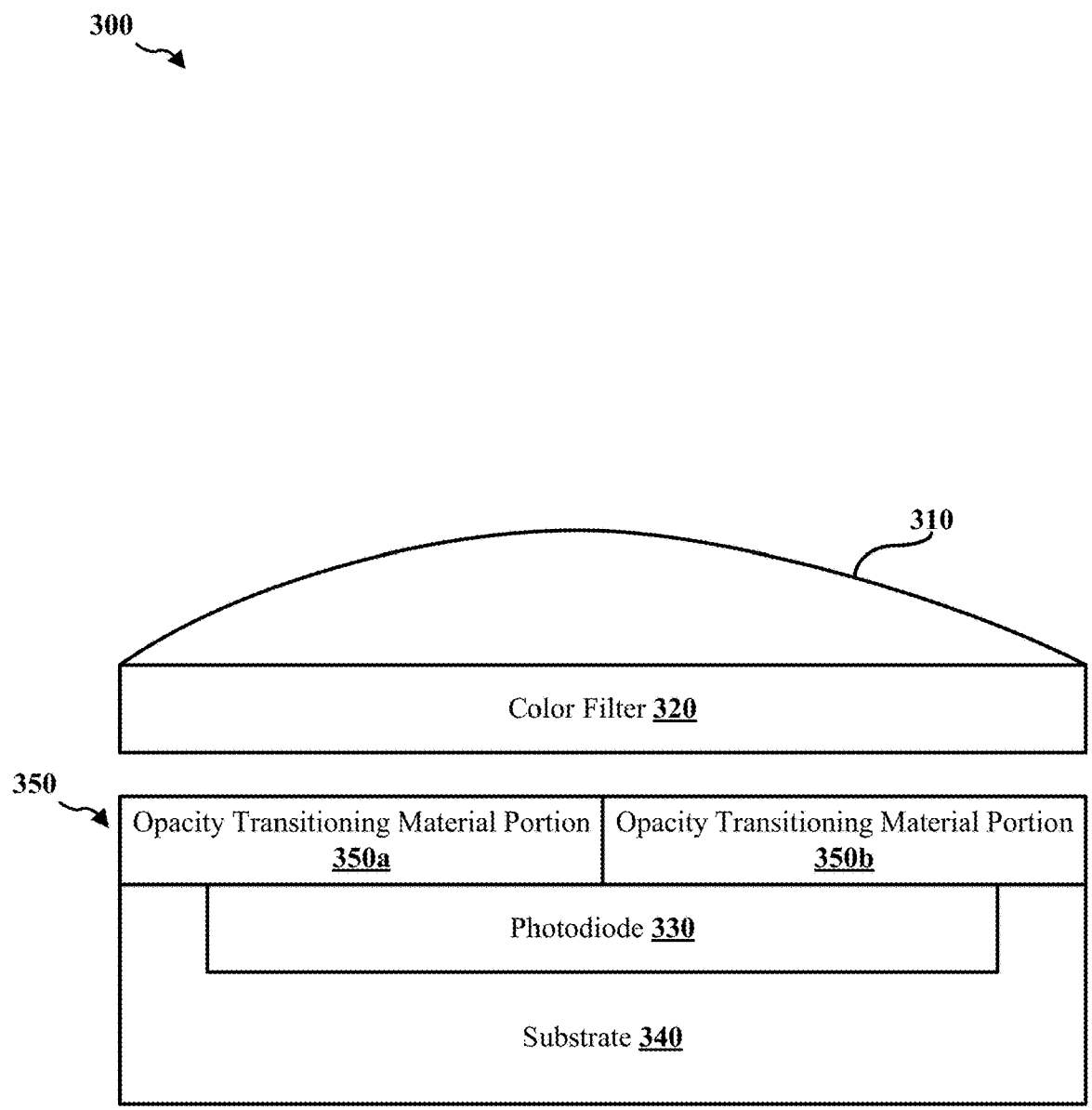
FIG. 3 illustrates a side view of an example configurable pixel of an image sensor, in accordance with one or more techniques of this disclosure.

FIG. 3 illustrates a side view of a configurable pixel 300 of the image sensor 254 of FIG. 2, in accordance with techniques disclosed herein. The configurable pixel 300 includes three components in common with an imaging pixel, including a microlens 310, a color filter 320, and a photodiode 330. The microlens 310 may be configured to focus received light onto the photodiode 330. The color filter 320 may be red, green, or blue (R, G, or B) arranged in a Bayer pattern. In other examples, the color filter 320 may be arranged in a cyan, yellow, green, and magenta pattern, a red, green, blue, and emerald pattern, a cyan, magenta yellow, and white pattern, a red, green, blue, and white pattern, or other pattern. The photodiode 330 of FIG. 3 is positioned within a substrate 340, such as a silicon substrate.

The configurable pixel 300 of FIG. 3 includes an opacity transitioning material 350 positioned between the color filter 320 and the photodiode 330. The opacity transitioning material 350 may be an electrically controlled material, such as a liquid crystal, that may appear transparent or opaque. When the opacity transitioning material 350 is transparent, light may be received by the photodiode 330. When the opacity transitioning material 350 is opaque, light is blocked from being received by the photodiode 330.

In the illustrated example of FIG. 3, the opacity transitioning material 350 is divided into a first opacity transitioning material portion 350a and a second opacity transitioning material portion 350b, and each portion 350a, 350b may be independently controlled. When no charge (or current or voltage) is applied to the opacity transitioning material 350, the opacity transitioning material 350 appears transparent and the configurable pixel 300 may operate as an imaging pixel, such as the red/green/blue pixels 104 of FIG. 1. When a charge (or current or voltage) is applied to the opacity transitioning material 350, the respective portion 350a, 350b becomes opaque, which generates a similar effect as using a metal shielding to block light (as shown in FIG. 1), and the configurable pixel may operate as a focus pixel, such as the focus pixels 106 of FIG. 1. Example techniques for applying the charge (or current or voltage) are described below in connection with the charge component 256 of FIG. 2.

Accordingly, the configurable pixel 300 may be configured to operate as a focus pixel or an imaging pixel based on whether a charge is applied to the opacity transitioning material 350. Moreover, the density of focus pixels associated with a region of interest of an image may be adjusted by applying (or not applying) a charge to respective ones of the configurable pixels 300 of the image sensor 254.

In some examples, the plurality of pixels of the image sensor 254 may be configurable pixels. In some such examples, each pixel of the image sensor 254 may be configured to operate as a focus pixel and/or an imaging pixel.

In some examples, the set of configurable pixels may be less than the plurality of pixels of the image sensor 254. For example, one or more of the pixels of the image sensor 254 may be dedicated imaging pixels and the remaining pixels may be configurable pixels. In some such examples, the dedicated imaging pixels may be positioned along the periphery of the image sensor 254. It should be appreciated that the ratio of dedicated imaging pixels to configurable pixels may vary.

Figure 4A:
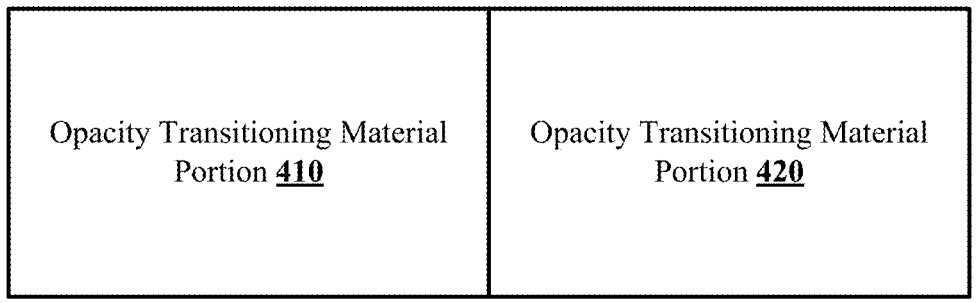
FIGS. 4A and 4B illustrate top view of configurable pixels, in accordance with one or more techniques of this disclosure.

In some examples, the opacity transitioning material 350 may be divided into two independently controllable portions (as shown in FIG. 3). FIG. 4A illustrates a top view of a configurable pixel 400 including a first (or left) opacity transitioning material portion 410 and a second (or right) opacity transitioning material portion 420. In the illustrated example of FIG. 4A, the portions 410, 420 are positioned so that the configurable pixel 400 may operate as a left-right focus pixel. For example, a charge may be applied to the left opacity transitioning material portion 410 and the configurable pixel 400 may operate as a "right focus pixel," because light entering the right opacity transitioning material portion 420 may reach the photodiode. Similarly, when a charge is applied to the right opacity transitioning material portion 420, the configurable pixel 400 may operate as a "left focus pixel," because light entering the left opacity transitioning material portion 410 may reach the photodiode. Aspects of the portions 410, 420 may be implemented by the portions 350 of FIG. 3.

Figure 4B:
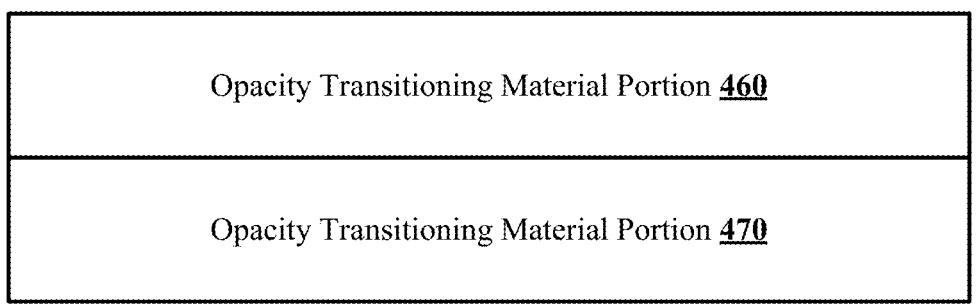

FIG. 4B illustrates a top view of a configurable pixel 450 including a first (or upper) opacity transitioning material portion 460 and a second (or lower) opacity transitioning material portion 470. In the illustrated example of FIG. 4B, the portions 460, 470 are positioned so that the configurable pixel 400 may operate as an up-down focus pixel. For example, a charge may be applied to the upper opacity transitioning material portion 460 and the configurable pixel 450 may operate as a "down focus pixel," because light entering the lower opacity transitioning material portion 470 may reach the photodiode. Similarly, when a charge is applied to the lower opacity transitioning material portion 470, the configurable pixel 450 may operate as an "up focus pixel," because light entering the upper opacity transitioning material portion 460 may reach the photodiode. Aspects of the portions 460, 470 may be implemented by the portions 350 of FIG. 3.

Figure 5A:
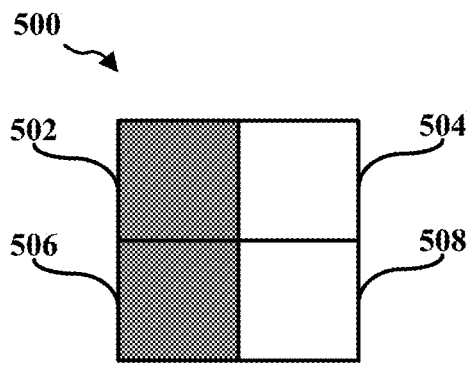
FIGS. 5A to 5F illustrate top views of focus orientations for configurable pixels in which the opacity transitioning material is divided into four independently-controllable portions, in accordance with one or more techniques of this disclosure.
Figure 5B:
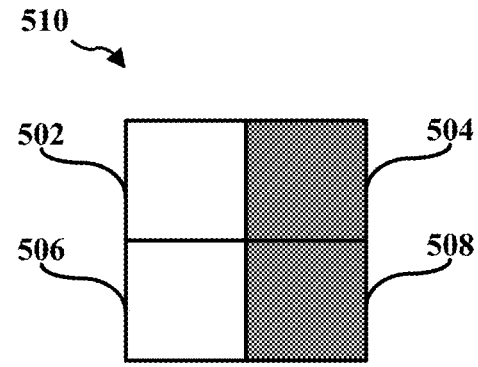

FIGS. 5A to 5F illustrate top views of focus orientations for configurable pixels in which the opacity transitioning material is divided into four independently-controllable portions 502, 504, 506, 508. Aspects of the portions 502, 504, 506, 508 may be implemented by the portions 350 of FIG. 3, the portions 410, 420 of FIG. 4A, and/or the portions 460, 470 of FIG. 4B. In some examples, the focus orientation of the configurable pixel may be determined based on which portions of the opacity transitioning materials a charge is applied. FIGS. 5A and 5B illustrate configurable pixels with a left-right focus orientation. For example, FIG. 5A illustrates a configurable pixel 500 configured to operate as a "right focus pixel," because a charge is applied to a first opacity transitioning material portion 502 and a third opacity transitioning material portion 506, and a charge is not applied to a second opacity transitioning material portion 504 and a fourth opacity transitioning material portion 508. FIG. 5B illustrates a configurable pixel 510 configured to operate as a "left focus pixel," because a charge is applied to the second opacity transitioning material portion 504 and the fourth opacity transitioning material portion 508, and a charge is not applied to the first opacity transitioning material portion 502 and the third opacity transitioning material portion 506.

Figure 5C:
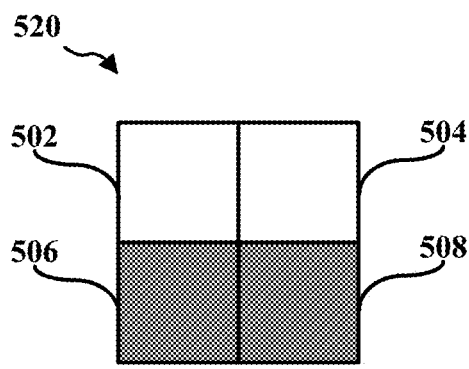
Figure 5D:
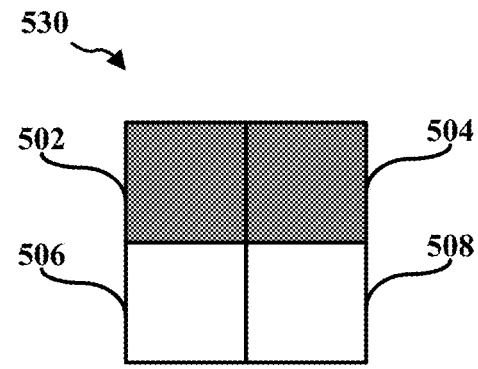

FIGS. 5C and 5D illustrate configurable pixels with an up-down focus orientation. For example, FIG. 5C illustrates a configurable pixel 520 configured to operate as an "upper focus pixel," because a charge is applied to the third opacity transitioning material portion 506 and the fourth opacity transitioning material portion 508, and a charge is not applied to the first opacity transitioning material portion 502 and the second opacity transitioning material portion 504. FIG. 5D illustrates a configurable pixel 530 configured to operate as a "lower focus pixel," because a charge is applied to the first opacity transitioning material portion 502 and the second opacity transitioning material portion 504, and a charge is not applied to the third opacity transitioning material portion 506 and the fourth opacity transitioning material portion 508.

Figure 5E:
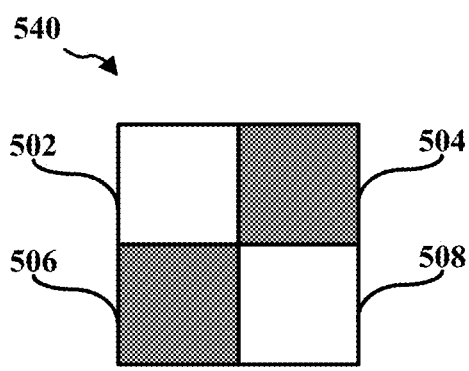
Figure 5F:
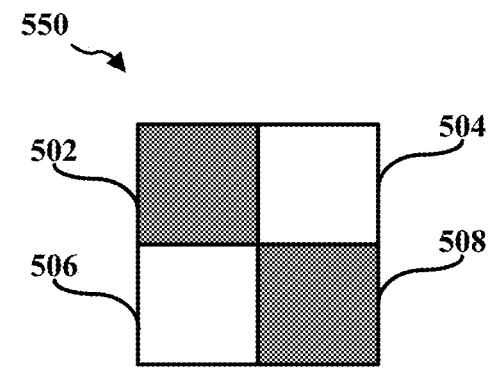

FIGS. 5E and 5F illustrate configurable pixels with a diagonal focus orientation. For example, FIG. 5E illustrates a configurable pixel 540 configured to operate as an "upper-left, lower-right focus pixel," because a charge is applied to the second opacity transitioning material portion 504 and the third opacity transitioning material portion 506, and a charge is not applied to the first opacity transitioning material portion 502 and the fourth opacity transitioning material portion 508. FIG. 5F illustrates a configurable pixel 550 configured to operate as an "upper-right, lower-left focus pixel," because a charge is applied to the first opacity transitioning material portion 502 and the fourth opacity transitioning material portion 508, and a charge is not applied to the second opacity transitioning material portion 504 and the third opacity transitioning material portion 506.

Although the example configurable pixels of FIGS. 4A and 4B illustrate the opacity transitioning material arranged into two portions and the example configurable pixels of FIGS. 5A to 5F illustrate the opacity transitioning material arranged into four portions, it should be appreciated that other examples may include additional or alternative quantity and/or arrangement of portions. Moreover, it should be appreciated that while the illustrated examples of FIGS. 5A to 5F include setting two of the four opacity transitioning material portions to opaque, in other examples, any suitable quantity of the opacity transitioning material portions may be configured to be opaque to enable the respective pixel to operate as a focus pixel.

Furthermore, it should be appreciated that in some examples, different configurable pixels may be configured to operate as focus pixels having different focus orientations. For example, a first subset of configurable pixels may be configured to operate as focus pixels with a left-right focus orientation (as shown in FIGS. 5A and 5B), a second subset of configurable pixels may be configured to operate as focus pixels with an up-down focus orientation (as shown in FIGS. 5C and 5D), and/or a third subset of configurable pixels may be configured to operate as focus pixels with a diagonal focus orientation (as shown in FIGS. 5E and 5F).

Referring again to FIG. 2, the charge component 256 may be coupled to portions of the opacity transitioning material of the selected configurable pixels of the set of the configurable pixels, for example, via a wire. The charge component 256 may be configured to apply a charge (or current or voltage) to portions of the opacity transitioning material of selected configurable pixels of the set of the configurable pixels (e.g., via the wire) to cause the selected configurable pixels to operate as focus pixels. Additionally, the charge component 256 may be configured to not apply a charge (or current or voltage) to the non-selected configurable pixels of the set of the configurable pixels (e.g., via the wire) to cause the non-selected configurable pixels to operate as imaging pixels. Although the above description provides an example in which the charge component 256 is coupled to portions of the opacity transitioning material via a wire, it should be appreciated that other examples may use additional or alternative techniques for coupling the charge component 256 to the portions of the opacity transitioning material. For example, the charge component 256 may be coupled to the portions of the opacity transitioning material via an electrode.

Referring still to FIG. 2, in some aspects, the processing unit 220 may be configured to operate one or more techniques disclosed herein. For example, the processing unit 220 may include a determination component 298 configured to receive first image data of a first frame of a scene. The determination component 298 may be configured to determine at least one region of interest or region of non-interest of the first frame. The determination component 298 may be configured to select, based on the determined at least one region of interest or region of non-interest, a subset of the set of configurable pixels to be focus pixels. The determination component 298 may also be configured to cause the selected subset of the set of configurable pixels to operate as focus pixels.

Figure 6:
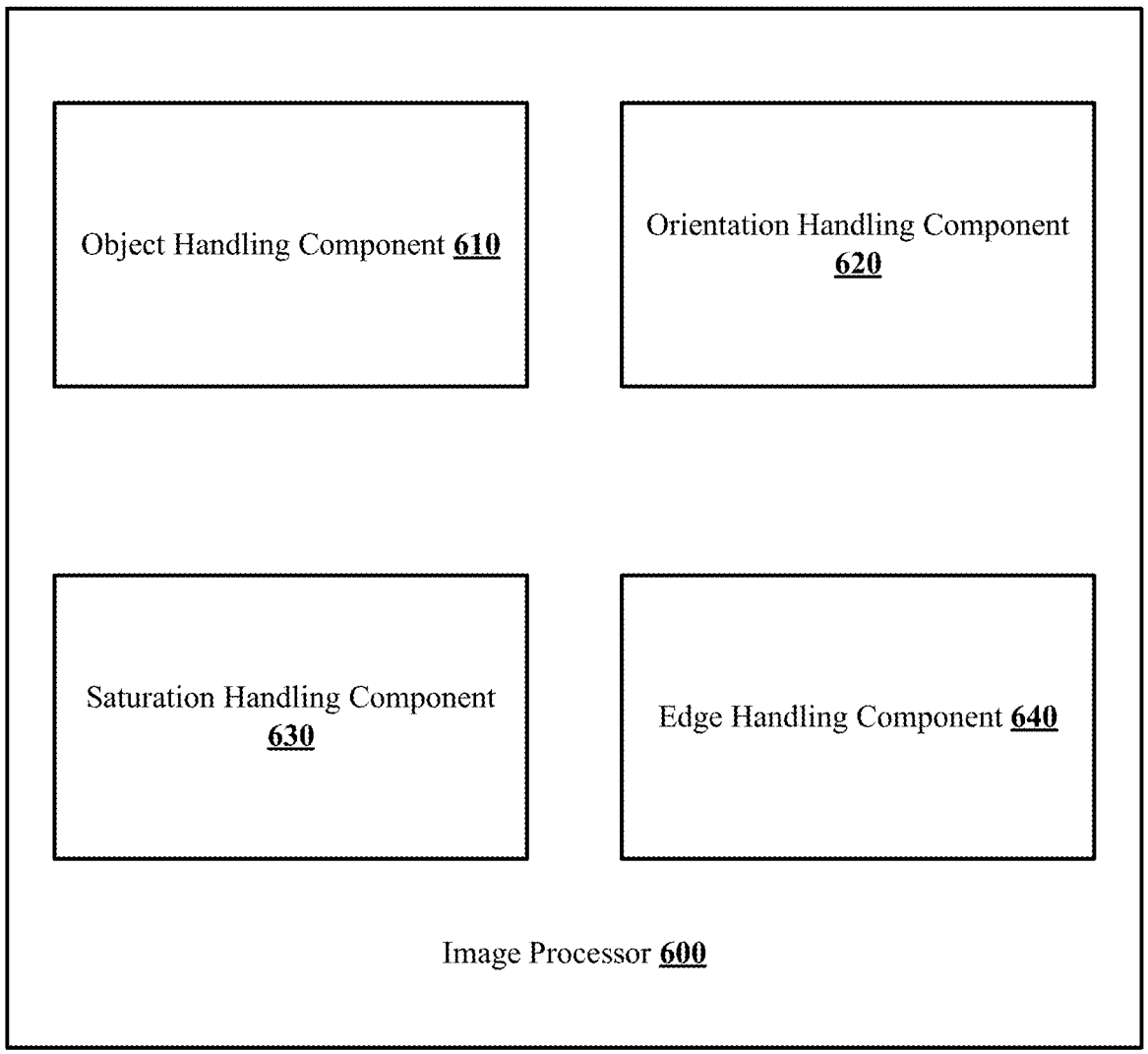
FIG. 6 is a block diagram of an image processor, in accordance with one or more techniques of this disclosure.

FIG. 6 illustrates a block diagram of an image processor 600, in accordance with aspects of this disclosure. One or more aspects of the image processor 600 may be implemented by the processing unit 220 of FIG. 2. The example image processor 600 may include one or more processors that are configured to execute an object handling component 610, an orientation handling component 620, a saturation handling component 630, and an edge handling component 640.

In the illustrated example, the image processor 600 is configured to receive image data for a frame. For example, the image processor 600 may receive image data for a frame of a scene from the image sensor 254 of FIG. 2. In some examples, the image data may include no focus data. For example, the configurable pixels of the image sensor 254 may be configured to operate as imaging pixels when the image sensor 254 generates the image data. In some examples, the image data may include focus data. For example, a subset of the configurable pixels of the image sensor 254 may be configured to operate as focus pixels when the image sensor 254 generates the image data. In some examples, the subset of the configurable pixels configured to operate as focus pixels may be a default subset of the configurable pixels. For example, the default subset of the configurable pixels may be a predetermined quantity and/or pattern of focus pixels that is not based on scene analysis techniques performed on previously received image data (e.g., for a previous frame). In some examples, the subset of the configurable pixels configured to operate as focus pixels may be based on the performing of the one or more scene analysis techniques on previously received image data. In some examples, the focus data may be used to adjust the focus of the device 204.

The example image processor 600 may also be configured to perform one or more scene analysis techniques on the received image data, and select a subset of the configurable pixels of the image sensor 254 to operate as focus pixels based on the performing of the one or more scene analysis techniques. The image processor 600 may cause the selected subset of configurable pixels to operate as focus pixels by instructing the charge component 256 to apply a charge to the respective opacity transitioning material portion(s) for the selected subset of configurable pixels.

The example image processor 600 may also be configured to identify regions of interest and/or regions of non-interest in the image based on an analysis of the image data. For example, the image processor 600 may identify regions utilizing artificial intelligence mechanisms and/or machine learning mechanisms. In some examples, the image processor 600 may receive information indicating a region of interest or a region of non-interest. For example, the image processor 600 may receive user input via an input interface. In some such examples, the image processor 600 may determine at least one region of interest and/or region of non-interest based on the received user input.

In some examples, the image processor 600 may be configured to adjust the density of focus pixels within the image sensor that are associated with an identified region based on the performing of the one or more scene analysis techniques. For example, the image processor 600 may be configured to increase or decrease the quantity of focus pixels associated with an identified region. In some examples, the image processor 600 may be configured to adjust the quantity of focus pixels associated with a sub-region of the identified region. For example, the image processor 600 may identify a region (or area) of non-interest within a region of interest. In some such examples, the image processor 600 may increase the quantity of focus pixels of the image sensor that are associated with the region of interest and also decrease the quantity of focus pixels associated with the identified region of non-interest.

In the illustrated example of FIG. 6, the image processor 600 is configured to include the object handling component 610 to facilitate implementing object detection and/or recognition techniques. In some examples, an image may include one or more identified regions. In some such examples, the object handling component 610 may be configured to determine whether an identified region is a region of interest or a region of non-interest. For example, the object handling component 610 may be configured to implement one or more object detection and/or recognition mechanisms to identify (e.g., detect and/or recognize) an object in the image.

Figure 7:
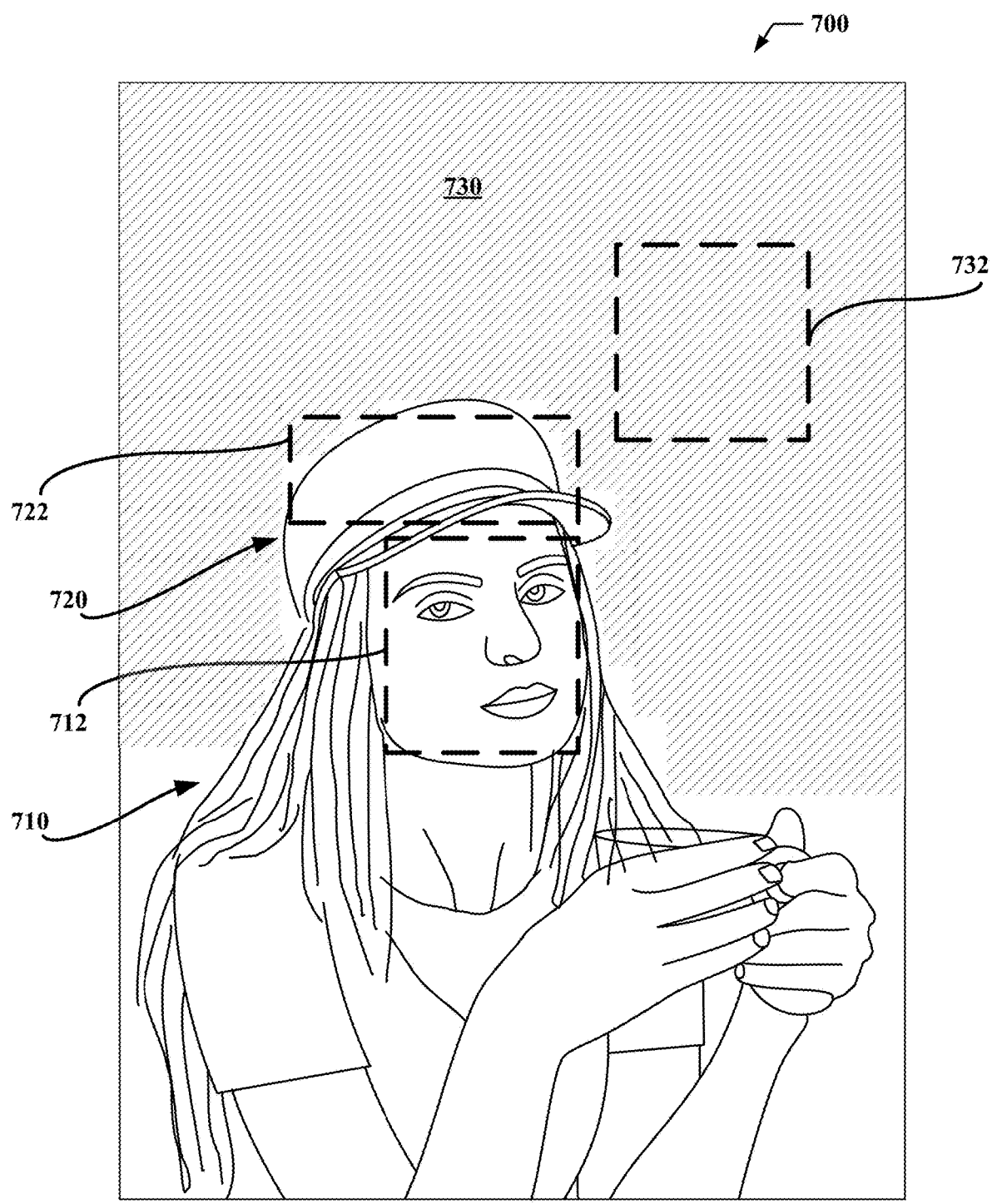
FIG. 7 depicts an example image, in accordance with one or more techniques of this disclosure.

FIG. 7 depicts an image 700 including a person 710 wearing a hat 720 in the foreground and a wall 730 in the background. In the illustrated example, the object handling component 610 of FIG. 6 may identify a first region 712 corresponding to the face of the person 710, a second region 722 corresponding to the hat 720, and a third region 732 corresponding to the wall 730. The object handling component 610 may classify each identified region 712, 722, 732 based on the object detected and/or recognized within the respective region. For example, the object handling component 610 may classify the first region 712 corresponding to the face of the person 710 and the second region 722 corresponding to the hat 720 as regions of interest. The object handling component 610 may classify the third region 732 corresponding to the wall 730 as a region of non-interest. In some examples, the object handling component 610 may be configured to classify the region based on a target item or an item of interest, such as a face or person.

In some examples, the object handling component 610 may be configured to sub-classify the identified regions based on the detected and/or recognized objects. For example, the object handling component 610 may be configured to classify the face of the person 710 as an object of first-level importance, classify the hat 720 as an object of second-level importance, and classify the wall 730 as an object of third-level importance. In some such examples, the second-level of importance may be less important than the first-level of importance and may be more important than the third-level of importance.

The object handling component 610 may also be configured to determine how to adjust the density of focus pixels corresponding to each of the identified regions. For example, the object handling component 610 may determine to increase the density of focus pixels associated with regions of interest and/or to decrease the density of focus pixels associated with regions of non-interest. In some examples, the density of focus pixels associated with a region of non-interest may be decreased such that the configurable pixels corresponding to the region of non-interest are configured to operate as imaging pixels. In some examples, the object handling component 610 may determine to adjust the density of focus pixels based on the different levels of importance. For example, regions of first-level importance may be associated with a first density-level, regions of second-level importance may be associated with a second density-level, and regions of third-level importance may be associated with a third density-level. In some such examples, the second density-level may be less dense than the first density-level and may be more dense than the third density level.

It should be appreciated that areas of the image that do not correspond to the identified regions may be associated with a background density-level. For example, the area of the image 700 corresponding to the hair or shirt of the person 710 may be associated with the background density-level. In some examples, one or more of the density-levels may be of greater density than the background density-level and/or may be of less density than the background density-level. For example, in some examples, the first density-level, the second density-level, and the third density-level may be greater than the background density-level. In some examples, the density-level for regions of interest (e.g., the first region 712 and the second region 722) may be of greater density than the background density-level and the density-level for regions of non-interest (e.g., the third region 732) may be less dense than the background density-level.

In the illustrated example of FIG. 6, the image processor 600 is configured to include the orientation handling component 620 to facilitate implementing focus data orientation detection techniques. In some examples, an identified region may include a texture or edge that is oriented in a particular direction, such as a horizontal texture or a vertical texture. In some such examples, if the focus pixels corresponding to the identified region have a same focus orientation as the texture or edge, then the focus data generated by the respective focus pixels may not be useful for PDAF purposes.

Figure 8:
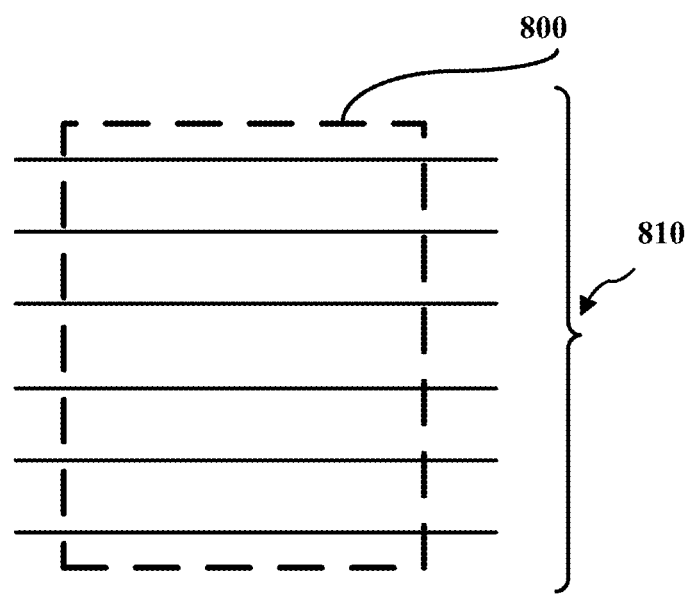
FIG. 8 depicts a region of interest including a plurality of horizontal textures, in accordance with one or more techniques of this disclosure.

In some examples, the orientation handling component 620 may be configured to perform a confidence test based on the focus data received for image data. For example, the confidence test may measure noise associated with the focus data along the focus orientation of the respective focus pixels. FIG. 8 depicts a region of interest 800 including a plurality of horizontal textures 810. It should be appreciated that if the focus pixels corresponding to the region of interest 800 have a left-right focus orientation, focus data generated by the focus pixels may not provide useful information for PDAF purposes. For example, the orientation handling component 620 may be unable to determine the offset between a left image and a right image generated by left focus pixels and right focus pixels, respectively.

In the illustrated example, the orientation handling component 620 may be configured to set a first focus orientation for focus pixels associated with an identified region. For example, the first focus orientation may be a default focus orientation, such as a left-right focus orientation (as shown in FIGS. 5A and 5B). The orientation handling component 620 may perform the confidence test based on image data received from the focus pixels having the first focus orientation.

In some examples, if the confidence level generated by the confidence test satisfies a confidence threshold, the orientation handling component 620 may determine that the current focus orientation of the focus pixels associated with the identified region is capable of providing useful information for PDAF purposes. However, if the confidence level does not satisfy the confidence threshold, the orientation handling component 620 may determine to change the focus orientation of the focus pixels associated with the identified region. For example, the orientation handling component 620 may determine to change the focus orientation to the up-down focus orientation (as shown in FIGS. 5C and 5D) or the diagonal focus orientation (as shown in FIGS. 5E and 5F).

In some examples, the confidence level may satisfy the confidence threshold when the confidence level is greater than or equal to the confidence threshold. In some examples, the confidence level may satisfy the confidence threshold when the confidence level is greater than the confidence threshold. However, it should be appreciated that in some examples, the confidence level may satisfy the confidence threshold when the confidence level is less than or equal to the confidence threshold or when the confidence level is less than the confidence threshold.

In some examples, the confidence level may be a numerical value, such as a number between zero and one hundred. In some such examples, the confidence threshold may be a numerical value between zero and one hundred. In some examples, the confidence level may be binary value corresponding to a "confident" or "non-confident" level. In some such examples, the confidence threshold may be a value corresponding to "confident."

It should be appreciated that by adjusting the focus orientation of focus pixels of the image sensor that are associated with an identified region when the confidence level does not satisfy the confidence threshold, the orientation handling component 620 facilitates increasing the likelihood of receiving useful information for PDAF purposes from focus data generated during a subsequent frame.

In the illustrated example of FIG. 6, the image processor 600 is configured to include the saturation handling component 630 to facilitate implementing saturation detection techniques. In some images, a region of interest may include a saturated area. Focus data generated by focus pixels associated with a saturated area may not provide useful information for PDAF purposes. For example, focus data generated by focus pixels associated with the saturated area may not provide sufficient detail to measure an offset between focus pixel pairs.

Figure 9:
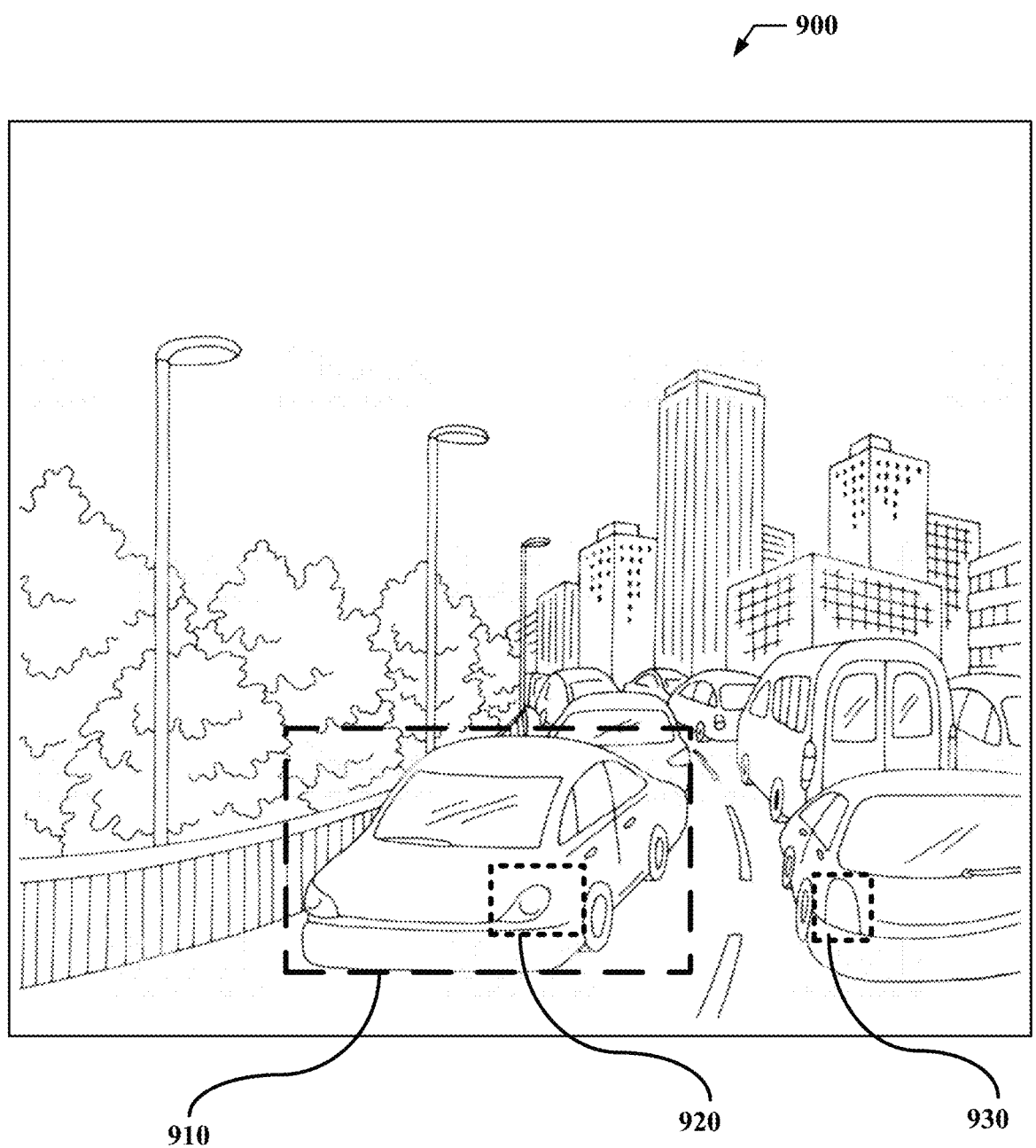
FIG. 9 depicts an example image including an identified region of interest, in accordance with one or more techniques of this disclosure.

FIG. 9 depicts an example image 900 including an identified region of interest 910 corresponding to a car. The example saturation handling component 630 may be configured to apply saturated area detection techniques to identify one or more saturated areas in a frame. In some examples, the saturation handling component 630 may identify a saturated area based on the digital values generated by the image sensor 254. For example, for a ten-bit digital value, the image sensor 254 may generate a digital value between 0 and 1023. In some such examples, the digital value 1023 represents a maximum amount of light that the image sensor 254 is capable of digitizing. In some examples, the saturation handling component 630 may be configured to apply a percentage of the maximum digital value capable of being output by the image sensor 254 to determine when an area is saturated.

In the illustrated example of FIG. 9, the saturation handling component 630 may identify a first saturated area 920 corresponding to a front headlight of a car and a second saturated area 930 corresponding to a rear taillight of another car. As shown in FIG. 9, the first saturated area 920 is within the identified region of interest 910.

In some examples, the saturation handling component 630 may determine to reduce the density of focus pixels of the image sensor that are associated with the saturated areas 920, 930. For example, the saturation handling component 630 may set the quantity of focus pixels associated with the saturated areas 920, 930 to zero focus pixels so that the configurable pixels of the image sensor that are associated with the saturated areas 920, 930 are configured to operate as imaging pixels.

In some examples, the saturation handling component 630 may determine whether a saturated area overlaps with an identified region of interest. For example, the saturation handling component 630 may determine that the identified region of interest 910 and the first saturated area 920 overlap. In some such examples, the saturation handling component 630 may determine to increase the density of focus pixels associated with the identified region of interest 910 and may determine to reduce the density of focus pixels associated with the first saturated area 920. For example, the saturation handling component 630 may determine to set the density-level of focus pixels associated with the identified region of interest 910 and outside the first saturated to a first density that is greater than the background density-level.

The saturation handling component 630 may also determine to set the density-level of focus pixels associated with the first saturated area 920 to a second density that is less than the first density. In some examples, the second density may correspond to zero focus pixels so that the configurable pixels associated with the first saturated area 920 are configured to operate as imaging pixels. In some examples, the second density may correspond to a density-level that is greater than zero focus pixels and less than the background density-level.

It should be appreciated that by reducing the density-level of focus pixels associated with a saturated area, the saturation handling component 630 facilitates reducing the amount of focus data generated that may not be useful for PDAF purposes. Additionally, by setting the configurable pixels associated with a saturated area to operate as imaging pixels, the saturation handling component 630 may also facilitate improving the quality of the image.

In the illustrated example of FIG. 6, the image processor 600 may be configured to include the edge handling component 640 to facilitate implementing edge detection techniques. In some examples, a scene may correspond to a low-light environment. For example, the digital values generated by the image sensor 254 may be less than a low-light environment threshold. For example, for a ten-bit digital value (ranging between 0 and 1023), a low-light environment may be indicated by digital values that are less than 100. However, it should be appreciated that additional or alternative examples may use other threshold values.

In a low-light environment, the digital values generated by the image sensor 254 may have low signal-to-noise ratios (SNR) and/or high noise. To improve the quality of the image, the image processor 600 may perform de-noising techniques, such as binning (or averaging) values (or data) of a plurality of nearby focus pixels having a same focus orientation (referred to collectively as "binning pixels").

Figure 10:
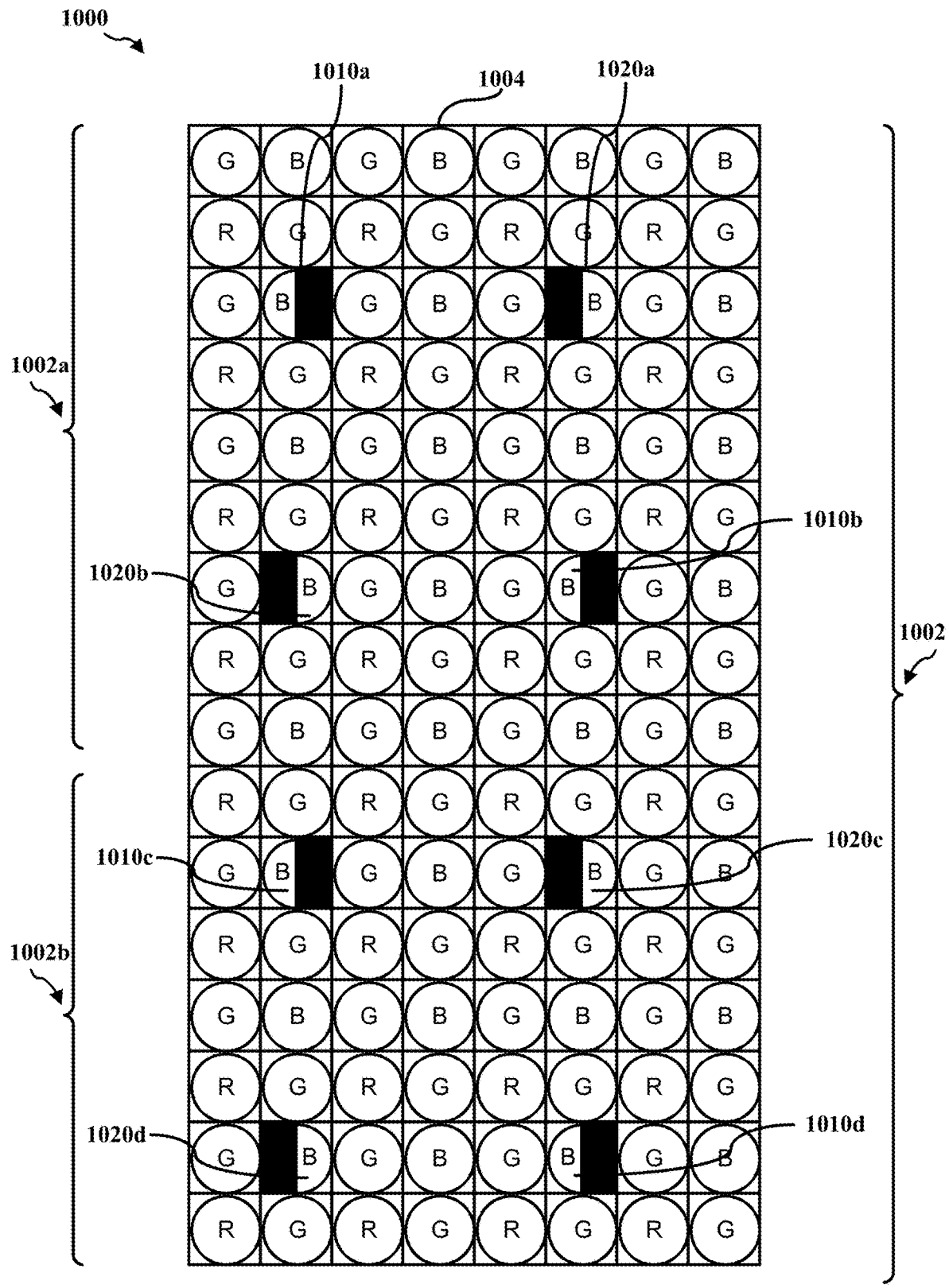
FIG. 10 illustrates a portion of an image sensor including an array of pixels, in accordance with one or more techniques of this disclosure.

FIG. 10 illustrates a portion of an image sensor 1000 including an array 1002 of pixels 1004. In the illustrated example, the portion of the image sensor 1000 corresponds to the configurable pixels operating as either imaging pixels or focus pixels associated with a region of interest for a first frame. In the illustrated example, the array 1002 includes a plurality of left focus pixels 1010 and a plurality of right focus pixels 1020. When performing binning, the image processor 600 may average the digital values of focus pixels having a same focus orientation. For example, in the illustrated example of FIG. 10, the image processor 600 may average the digital values of a first left focus pixel 1010a, a second left focus pixel 1010b, a third left focus pixel 1010c, and a fourth left focus pixel 1010d to determine the value of the second left focus pixel 1010b. Similarly, the binning pixels for determining the value of a second right focus pixel 1020b may include a first right focus pixel 1020a, the second right focus pixel 1020b, a third right focus pixel 1020c, and a fourth right focus pixel 1020d.

In some examples, the region of interest may include an edge. An edge may be determined by a change in luminance or a change in color. For example, the edge handling component 640 may be configured to detect an edge when the change in luminance and/or the change in color is greater than a threshold percentage. In some examples, the edge may correspond to a border between different objects. For example, referring to the example image 700 of FIG. 7, the edge handling component 640 may detect an edge within the second identified region 722 between the hat 720 and the forehead of the face of the person 710. In some examples, the edge handling component 640 may detect an edge between different areas of an object. For example, the edge handling component 640 may detect an edge between a screen of a monitor and a chassis of the monitor.

In the illustrated example of FIG. 10, an edge is detected within the first image associated with pixels between a first subset 1002a of pixels 1004 and a second subset 1002b of pixels 1004. Thus, the pixels 1004 within the first subset 1002a may be associated with a first similar luminance or a first similar color and the pixels 1004 within the second subset 1002b may be associated with a second similar luminance or a second similar color.

However, it should be appreciated that when binning, determining the value of a focus pixel by averaging the digital value of focus pixels across the edge may skew the average value for the focus pixel, which may result in an artifact. For example, determining the value of the second left focus pixel 1010b include averaging the digital value of the first left focus pixel 1010a and the second left focus pixel 1010b, which are within the first subset 1002a of pixels 1004 and are associated with the first similar luminance or the first similar color, and the third left focus pixel 1010c and the fourth left focus pixel 1010d, which are within the second subset 1002b of pixels 1004 and are associated with the second similar luminance or the second similar color.

To improve the performing of binning in low-light environments, the edge handling component 640 is configured to detect one or more edges within a region of interest.

If the edge handling component 640 detects an edge within a region of interest, the edge handling component 640 is configured to increase the density of focus pixels associated with respective sub-regions of the region of interest. For example, referring to the example of FIG. 10, the edge handling component 640 may be configured to increase the density of left focus pixels 1010 and right focus pixels 1020 within the first subset 1002a of pixels 1004 of the image sensor 1000. The edge handling component 640 may additionally or alternatively be configured to increase the density of left focus pixels 1010 and right focus pixels 1020 within the second subset 1002b of pixels 1004 of the image sensor 1000.

It should be appreciated that by increasing the density of focus pixels associated with the respective sub-regions of the region of interest, the edge handling component 640 may facilitate improving the quality of binning by reducing the likelihood of binning pixels extending across an edge. It should be appreciated that the binning may be performed on a subsequent frame of the scene.

In the illustrated example, after the object handling component 610, the orientation handling component 620, the saturation handling component 630, and/or the edge handling component 640 perform their respective scene analysis techniques and determine the changes, if any, to be made to the configurable pixels of the image sensor 254, the image processor 600 applies the respective pixel configurations for a subsequent frame. For example, a change in a pixel configuration may include changing a configurable pixel from operating as an imaging pixel to operating as a focus pixel (e.g., to increase the density of focus pixels associated with an identified region), changing a configurable pixel from operating as a focus pixel to operating as an imaging pixel (e.g., to decrease the density of focus pixels associated with an identified region), and/or changing a focus orientation of a focus pixel from a first focus orientation to a second focus orientation (e.g., to increase the likelihood of receiving useful information for PDAF purposes from focus data generated by focus pixel associated with a region including a texture).

FIGS. 11 to 15 illustrate example flowcharts of example methods in accordance with one or more techniques disclosed herein. The methods may be performed by an apparatus, such as the example device 204 of FIG. 2, and/or a component of the apparatus, such as the example processing unit 220 of FIG. 2 and/or the image processor 600 of FIG. 6. According to various aspects, one or more of the illustrated operations of the methods may be omitted, transposed, and/or contemporaneously performed. Optional aspects are illustrated with a dashed line. In the illustrated examples of FIGS. 11 to 15, the apparatus is configured to include an image sensor having a plurality of pixels including a set of pixels configurable to operate as imaging pixels or focus pixels, such as the example image sensor 254 of FIG. 2.

Figure 11:
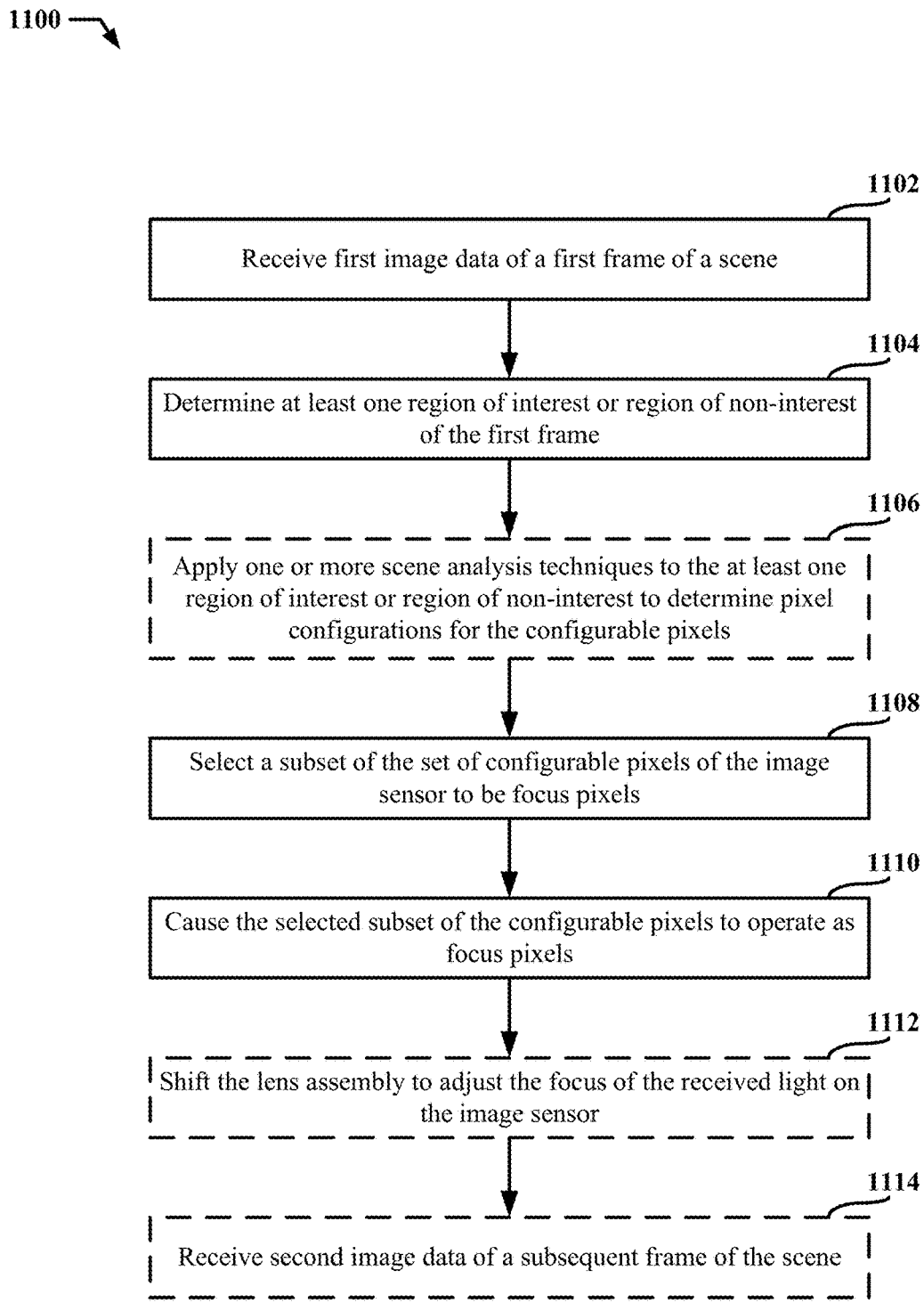
FIGS. 11 to 15 illustrate example flowcharts of example methods that may be implemented by the example device of FIG. 2, in accordance with one or more techniques of this disclosure.

FIG. 11 is a flowchart 1100 of a method employing a PDAF optical system, in accordance with one or more techniques disclosed herein. At 1102, the apparatus receives first image data of a first frame of a scene, as described in connection with the examples in FIGS. 2 to 10. For example, the processing unit 220 and/or the image processor 600 may be configured to receive the first image data from the image sensor 254. It may be appreciated that the configurable pixels of the image sensor 254 may be configured to operate with a default configuration (e.g., as imaging pixels or as focus pixels having a first focus orientation) or may be configured to operate with a previous pixel configuration (e.g., a first subset of configurable pixels are configured to operate as imaging pixels, a second subset of configurable pixels are configured to operate as focus pixels having a first focus orientation, a third subset of configurable pixels are configured to operate as focus pixels having a second focus orientation, etc.).

At 1104, the apparatus determines at least one region of interest or region of non-interest of the first frame, as described in connection with the examples in FIGS. 2 to 10. For example, the processing unit 220 and/or the image processor 600 may be configured to determine the at least one region of interest or region of non-interest of the first frame. In some examples, the apparatus may determine the identified region by applying object detection and/or recognition techniques. In some examples, the apparatus may receive user input indicating the at least one region of interest or region of non-interest and may then determine the region of interest or region of non-interest based on the received user input. It may be appreciated that in some examples, the region of interest or the region of non-interest may comprise the full frame.

At 1106, the apparatus may apply one or more scene analysis techniques to the at least one region of interest or region of non-interest to determine pixel configurations for the configurable pixels, as described in connection with the examples in FIGS. 2 to 10. For example, the processing unit 220 and/or the image processor 600 may be configured to apply the one or more scene analysis techniques to the at least one region of interest or region of non-interest to determine pixel configurations. In some examples, the apparatus may apply one or more of the object detection and/or recognition techniques, the focus data orientation detection techniques, the saturation detection techniques, and the edge detection techniques. Aspects of the object detection and/or recognition techniques are described below in connection with flowchart 1200 of FIG. 12. Aspects of the focus data orientation detection techniques are described below in connection with flowchart 1300 of FIG. 13. Aspects of the saturation detection techniques are described below in connection with flowchart 1400 of FIG. 14. Aspects of the edge detection techniques are described below in connection with flowchart 1500 of FIG. 15.

In some examples, the apparatus may determine to apply each of the four example scene analysis techniques. In some examples, the apparatus may determine to apply a subset of the example scene analysis techniques. In some examples, the apparatus may apply one or more of the example scene analysis techniques for each frame of a scene. In some examples, the apparatus may conserve power and/or computational resources of the apparatus by skipping one or more frames on which one or more of the example scene analysis techniques are applied. In some examples, the apparatus may perform an initial scene analysis (e.g., based on machine learning and/or artificial intelligence) to determine whether aspects of a scene changed between frames. In some such examples, the apparatus may conserve power and/or computational resources of the apparatus by applying the one or more scene analysis techniques when aspects of the scene changed between frames.

At 1108, the apparatus selects a subset of the set of configurable pixels of the image sensor to be focus pixels, as described in connection with the examples in FIGS. 2 to 10. For example, the processing unit 220 and/or the image processor 600 may be configured to select the subset of the set of configurable pixels to be focus pixels. In some examples, the apparatus may use the pixel configurations determined by the applying of the one or more scene analysis techniques (at 1106) to determine the subset of the set of configurable pixels to be focus pixels. In some examples, the pixel configurations may also provide focus orientations for the subset of configurable pixels configured to operate as focus pixels.

At 1110, the apparatus causes the selected subset of the configurable pixels to operate as focus pixels, as described in connection with the examples in FIGS. 2 to 10. For example, the processing unit 220 and/or the image processor 600 may be configured to cause the charge component 256 to apply a charge (or current or voltage) to the opacity transitioning material portions 350 of the subset of the configurable pixels of the image sensor 254 to cause the respective configurable pixels to operate as focus pixels. In some examples, the apparatus may additionally or alternatively change a focus orientation for one or more of the focus pixels. In some examples, the apparatus may additionally or alternatively cause one or more of the configurable pixels to operate as imaging pixels.

At 1112, the apparatus may shift the lens assembly to adjust the focus of the received light on the image sensor, as described in connection with the examples in FIGS. 2 to 10. For example, the processing unit 220 and/or the image processor 600 may be configured to shift the lens assembly 252 to adjust the focus of the received light on the image sensor 254.

At 1114, the apparatus may receive second image data of a subsequent frame of the scene, as described in connection with the examples in FIGS. 2 to 10. For example, the processing unit 220 and/or the image processor 600 may receive the second image data from the image sensor 254. In some examples, the second image data may include focus data from the selected subset of the set of configurable pixels and imaging data from the remaining pixels of the plurality of pixels of the image sensor.

Figure 12:
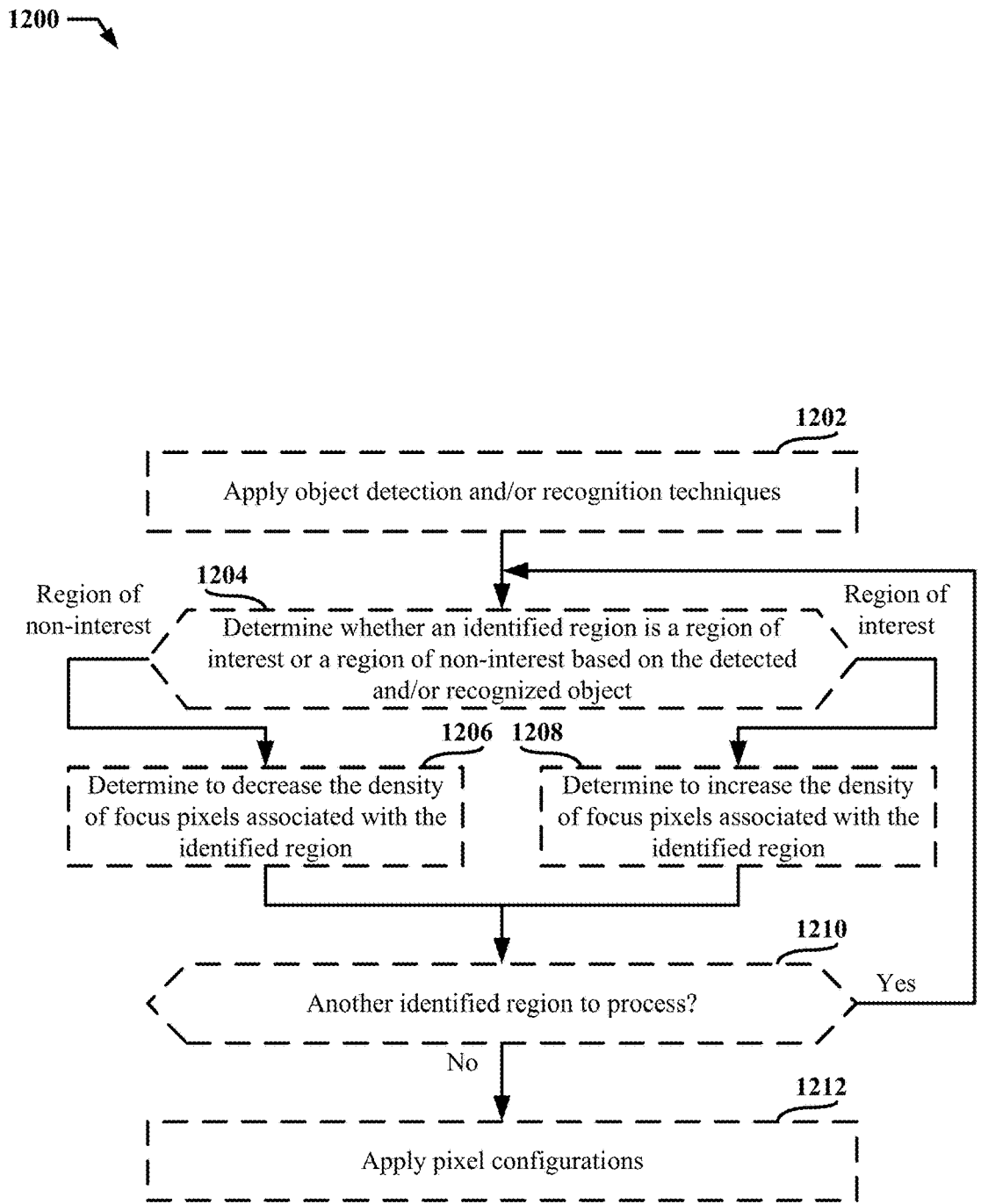

FIG. 12 is a flowchart 1200 of a method implementing object detection and/or recognition techniques, in accordance with one or more techniques disclosed herein. At 1202, the apparatus may apply object detection and/or recognition techniques, as described in connection with the examples in FIGS. 2 to 10. For example, the object handling component 610 may be configured to apply the object detection and/or recognition techniques. In some examples, the object detection and/or recognition techniques may be configured to detect and/or recognize different classes of objects. For example, the object detection and/or recognition techniques may be configured to detect and/or recognize an object of interest (e.g., a target item) and/or an object of non-interest. In some examples, the object detection and/or recognition techniques may be configured to sub-classify detected and/or recognized objects. For example, the object detection and/or recognition techniques may be configured to detect and/or recognize an object of high interest (e.g., a target item, such as a face) and/or may be configured to detect and/or recognize an object of low interest (e.g., a microphone).

At 1204, the apparatus may determine whether an identified region is a region of interest or a region of non-interest based on the detected and/or recognized object, as described in connection with the examples in FIGS. 2 to 10. For example, the object handling component 610 may be configured to determine whether the identified region is a region of interest or a region of non-interest based on the object detected and/or recognized within the identified region. In some examples, the identified regions may be associated with different levels of interest or non-interest based on the corresponding class (or sub-class) of the object detected and/or recognized within the identified region.

If, at 1204, the apparatus determines that the identified region is a region of non-interest (e.g., the object detected and/or recognized within the identified region is of non-interest), then, at 1206, the apparatus may determine to decrease the density of focus pixels associated with the identified region, as described in connection with the examples in FIGS. 2 to 10. For example, the object handling component 610 may be configured to determine to decrease the density of focus pixels within the image sensor 254 that are associated with the identified region by changing the configuration of one or more configurable pixels to operate as imaging pixels. Control then proceeds to 1210 to determine whether there is another identified region and detected and/or recognized object to process.

If, at 1204, the apparatus determines that the identified region is a region of interest (e.g., the detected and/or recognized object within the identified region is of interest), then, at 1208, the apparatus may determine to increase the density of focus pixels associated with the identified region, as described in connection with the examples in FIGS. 2 to 10. For example, the object handling component 610 may be configured to determine to increase the density of focus pixels within the image sensor 254 that are associated with the identified region. In some examples, the apparatus may determine to apply different density levels of focus pixels to different regions of interest based on, for example, sub-classifications of the detected and/or recognized objects. For example, the apparatus may set a first density level of focus pixels associated with a region of interest including an object of high interest (e.g., a face) and may set a second density level of focus pixels associated with a region of interest including an object of low interest (e.g., a microphone). In some such examples, the region of interest with the first density level may be relatively more dense of focus pixels than the region of interest with the second density level.

At 1210, the apparatus may determine whether there is another identified region to process based on the detected and/or recognized object, as described in connection with the examples in FIGS. 2 to 10. For example, the object handling component 610 may be configured to determine whether there is another identified region to process.

If, at 1210, the apparatus determines that there is another identified region to process, control returns to 1204 to determine whether the identified region is a region of interest or a region of non-interest based on the object detected and/or recognized within the identified region.

If, at 1210, the apparatus determines that there is not another identified region to process, then, at 1212, the apparatus may apply the pixel configurations, as described in connection with the examples in FIGS. 2 to 10. For example, the processing unit 220 and/or the image processor 600 may be configured to apply the pixel configurations to the configurable pixels of the image sensor to increase or decrease the density of focus pixels associated with an identified region.

Figure 13:
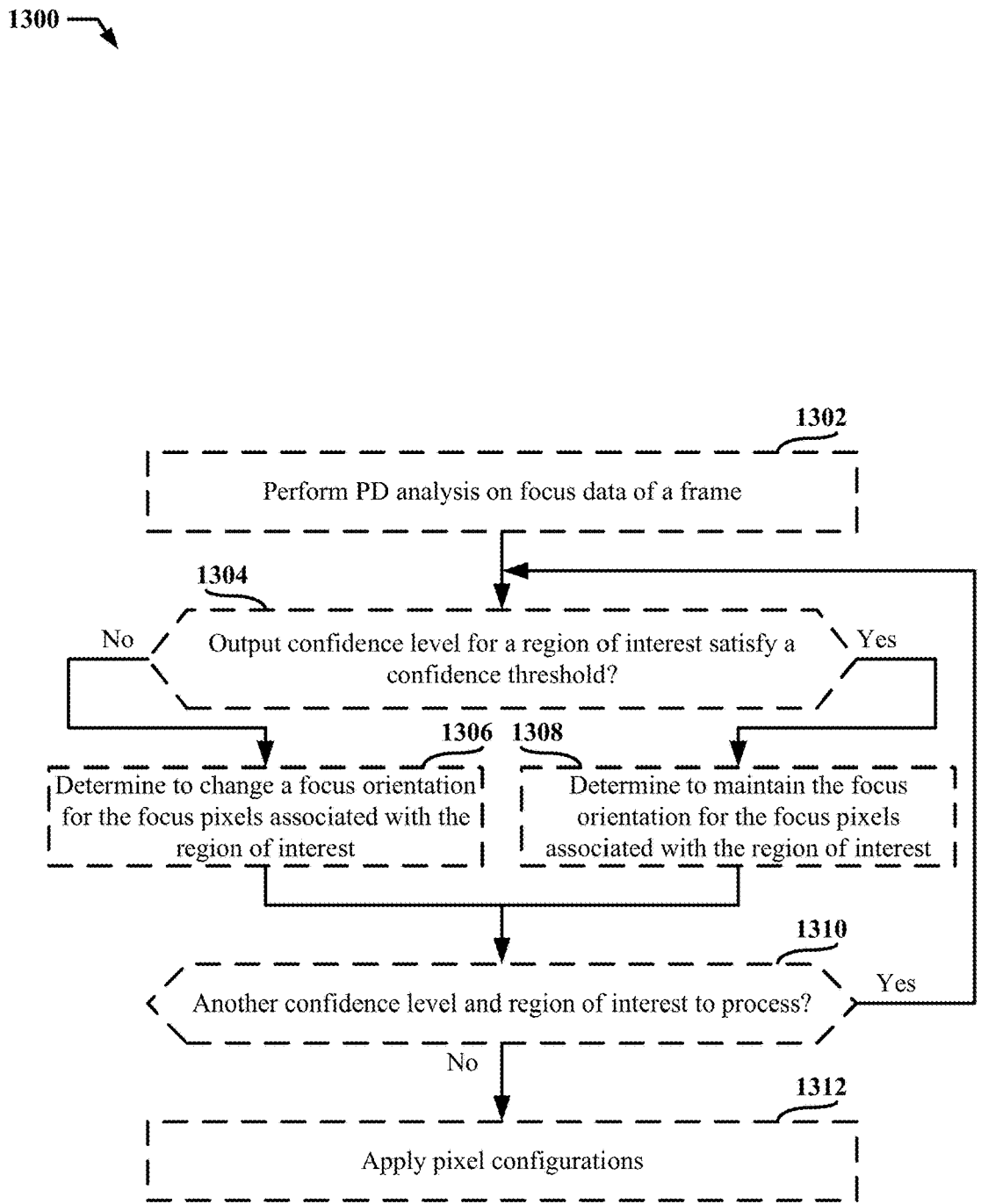

FIG. 13 is a flowchart 1300 of a method implementing focus data orientation detection techniques, in accordance with one or more techniques disclosed herein. At 1302, the apparatus may perform PD analysis on focus data of a frame, as described in connection with the examples in FIGS. 2 to 10. For example, the orientation handling component 620 may be configured to perform the PD analysis on the focus data of the frame. In some examples, the apparatus may output confidence levels for respective regions of interest of the frame.

At 1304, the apparatus may determine whether an output confidence level for a region of interest satisfies a confidence threshold, as described in connection with the examples in FIGS. 2 to 10. For example, the orientation handling component 620 may be configured to determine whether the output confidence level for the region of interest is greater than or equal to the confidence threshold.

If, at 1304, the apparatus determines that the output confidence level for the region of interest does not satisfy the confidence threshold (e.g., is less than the confidence threshold), then, at 1306, the apparatus may determine to change a focus orientation for the focus pixels associated with the region of interest. For example, the orientation handling component 620 may be configured to change the focus orientation for the focus pixels associated with the region of interest from a first focus orientation to a second focus orientation. It may be appreciated that in some examples, the orientation handling component 620 may be configured to determine to change the focus orientation for a subset of the focus pixels associated with the region of interest. Control then proceeds to 1310 to determine whether there is another confidence level and region of interest to process.

If, at 1304, the apparatus determines that the output confidence level for the region of interest satisfies the confidence threshold (e.g., is greater than or equal to the confidence threshold), then, at 1308, the apparatus may determine to maintain the focus orientation for the focus pixels associated with the region of interest. For example, the orientation handling component 620 may be configured to maintain the current focus orientation for the focus pixels associated with the region of interest.

At 1310, the apparatus may determine whether there is another confidence level and region of interest to process, as described in connection with the examples in FIGS. 2 to 10. For example, the orientation handling component 620 may be configured to determine whether there is another confidence level and region of interest to process. If, at 1310, the apparatus determines that there is another confidence level and region of interest to process, control returns to 1304 to determine whether the confidence level satisfies the confidence threshold.

If, at 1310, the apparatus determines that there is not another confidence level and region of interest to process, then, at 1312, the apparatus may apply the pixel configurations, as described in connection with the examples in FIGS. 2 to 10. For example, the processing unit 220 and/or the image processor 600 may be configured to apply the pixel configurations to the configurable pixels of the image sensor to change the focus orientation of one or more of the focus pixels.

Figure 14:
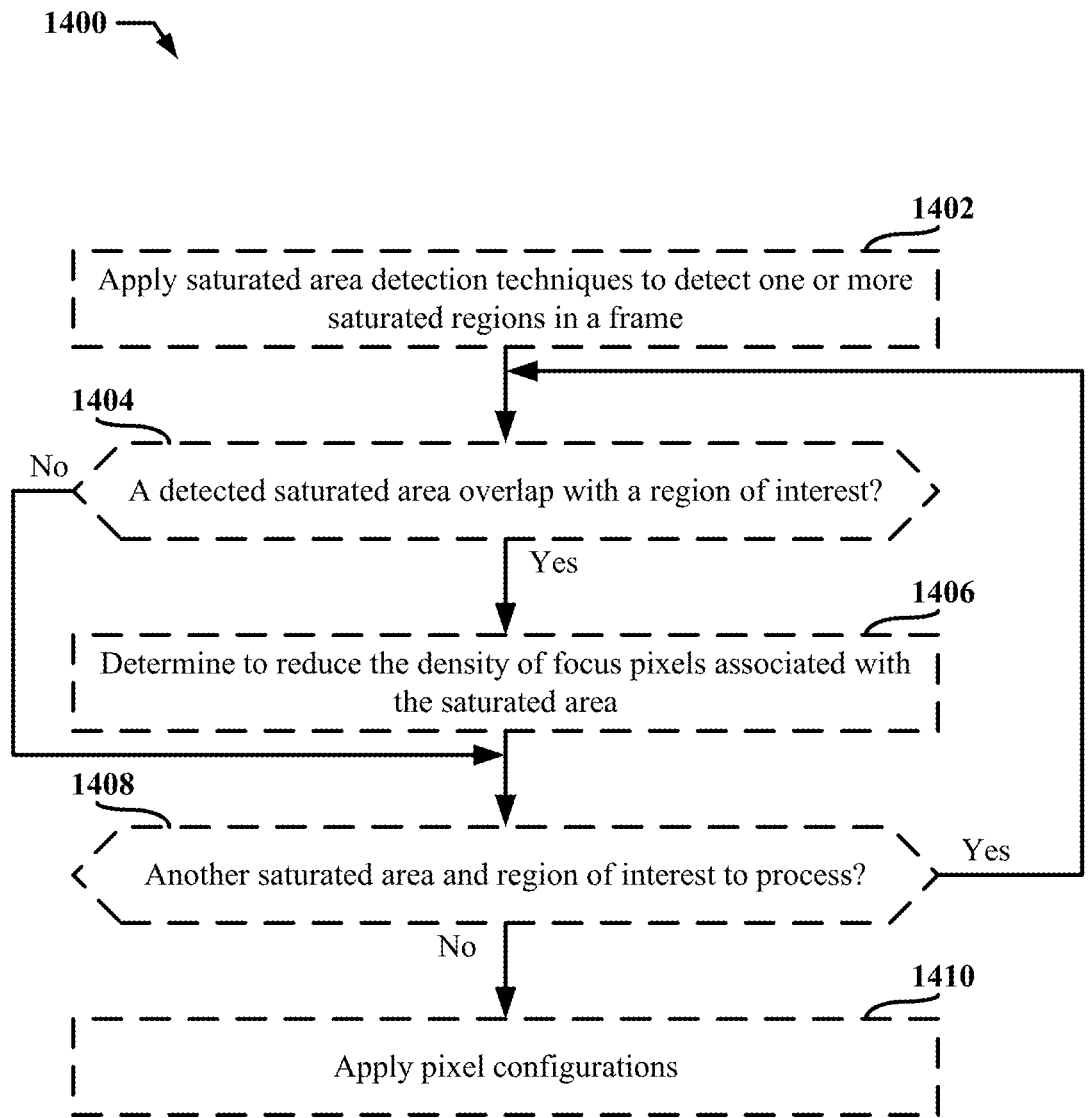

FIG. 14 is a flowchart 1400 of a method implementing saturation detection techniques, in accordance with one or more techniques disclosed herein. At 1402, the apparatus may apply saturated area detection techniques to detect one or more saturated regions in a frame, as described in connection with the examples in FIGS. 2 to 10. For example, the saturation handling component 630 may be configured to apply saturated area detection techniques to detect the one or more saturated regions in the frame.

At 1404, the apparatus may determine whether a detected saturated area overlaps with a region of interest, as described in connection with the examples in FIGS. 2 to 10. For example, the saturation handling component 630 may be configured to determine whether a detected saturated area overlaps with a region of interest. If, at 1404, the apparatus determines that the detected saturated area does not overlap with a region of interest, then control proceeds to 1408 to determine whether there is another saturated area and region of interest to process.

If, at 1404, the apparatus determines that the detected saturated area does overlap with a region of interest, then, at 1406, the apparatus may determine to reduce the density of focus pixels associated with the saturated area, as described in connection with the examples in FIGS. 2 to 10. For example, the saturation handling component 630 may be configured to determine to reduce the density of focus pixels associated with the saturated area. In some examples, the apparatus may set a first density level of focus pixels associated with the saturated area of the region of interest and may set a second density level of focus pixels for the non-saturated area of the region of interest. In some examples, the second density level is greater than the first density level. In some examples, the first density level may be zero so that the configurable pixels associated with the saturated area may be configured to operate as imaging pixels. Control then proceeds to 1408 to determine whether there is another detected saturated area to process.

At 1408, the apparatus may determine whether there is another detected saturated area to process, as described in connection with the examples in FIGS. 2 to 10. For example, the saturation handling component 630 may be configured to determine whether there is another detected saturated area to process. If, at 1408, the apparatus determines that there is another detected saturated edge to process, control returns to 1404 to determine whether the detected saturated area overlaps with a region of interest.

If, at 1408, the apparatus determines that there is not another detected saturated area to process, then, at 1410, the apparatus may apply the pixel configurations, as described in connection with the examples in FIGS. 2 to 10. For example, the processing unit 220 and/or the image processor 600 may be configured to apply the pixel configurations to the configurable pixels of the image sensor.

Figure 15:
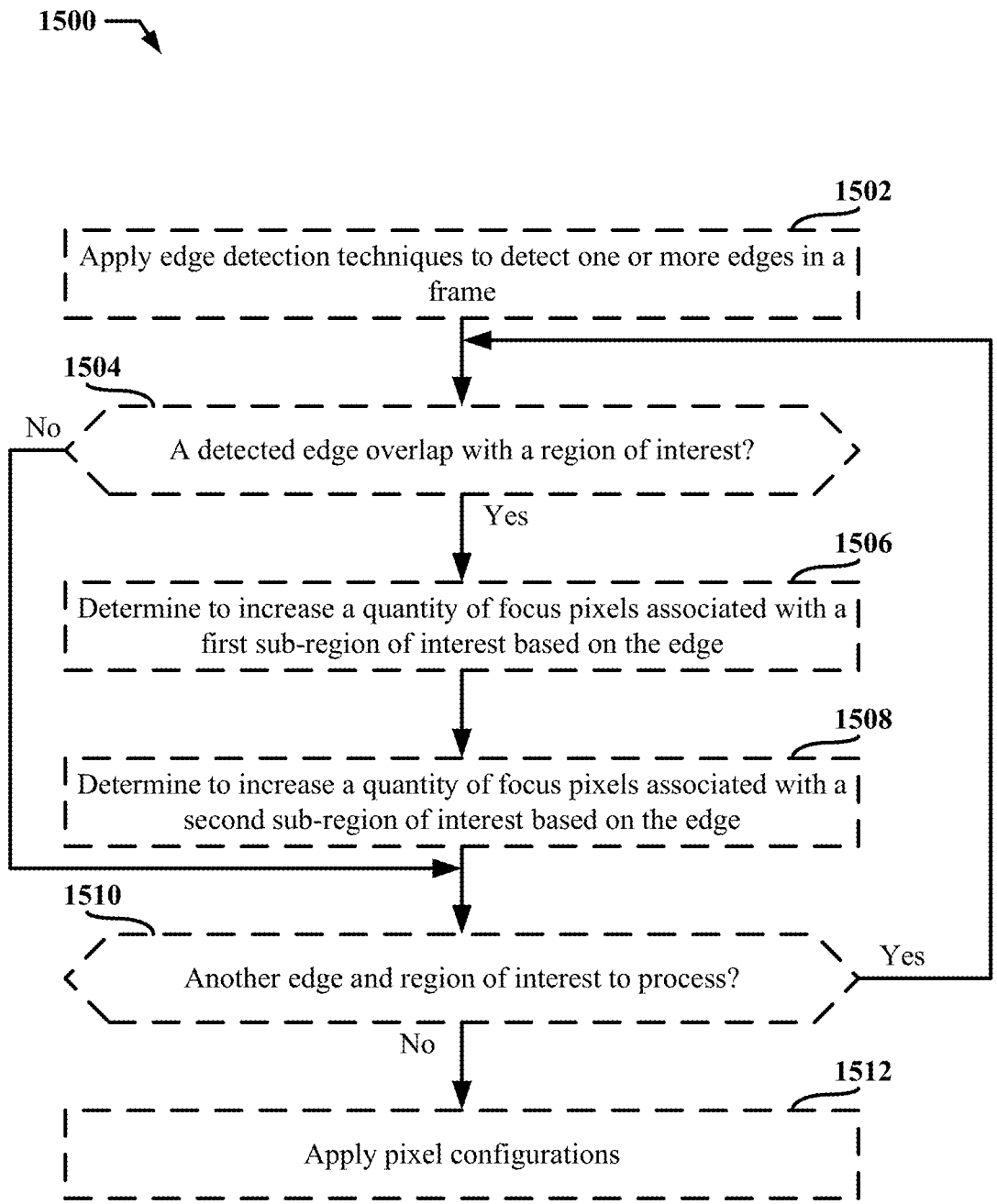

FIG. 15 is a flowchart 1500 of a method implementing edge detection techniques, in accordance with one or more techniques disclosed herein. In the illustrated example, the apparatus may apply the edge detection techniques when the scene corresponds to a low-light environment and where applying binning techniques may be beneficial in improving the quality of the image.

At 1502, the apparatus may apply edge detection techniques to detect one or more edges in a frame, as described in connection with the examples in FIGS. 2 to 10. For example, the edge handling component 640 may be configured to apply edge detection techniques. As described above, the edge detection techniques may be configured to detect a change in luminance or a change in color between proximate pixels. In some examples, the apparatus may apply a threshold change in luminance or color to determine whether a change in luminance or a change in color occurred. In some examples, the edge may represent the boundary between two or more objects (e.g., a desk and a wall) or a boundary between different areas of an object (e.g., a screen of a display monitor and a chassis of the display monitor).

At 1504, the apparatus may determine whether a detected edge overlaps with a region of interest, as described in connection with the examples in FIGS. 2 to 10. For example, the edge handling component 640 may be configured to determine whether a detected edge overlaps with a region of interest. If, at 1504, the apparatus determines that the detected edge does not overlap with a region of interest, then control proceeds to 1510 to determine whether there is another edge and region of interest to process.

If, at 1504, the apparatus determines that the detected edge does overlap with a region of interest, then, at 1506, the apparatus may determine to increase a quantity of focus pixels associated with a first sub-region of interest based on the edge, as described in connection with the examples in FIGS. 2 to 10. For example, the edge handling component 640 may be configured to determine to increase the quantity of focus pixels associated with the first sub-region of interest. In some examples, the first focus pixels associated with the first sub-region of interest may correspond to a same object (e.g., the screen of a display monitor) and/or have a similar luminance or color.

At 1508, the apparatus may determine to increase a quantity of focus pixels associated with a second sub-region of interest based on the edge, as described in connection with the examples in FIGS. 2 to 10. For example, the edge handling component 640 may be configured to determine to increase the quantity of focus pixels associated with the second sub-region of interest. In some examples, the second focus pixels associated with the second sub-region of interest may correspond to a same object (e.g., the chassis of a display monitor) and/or have a similar luminance or color.

At 1510, the apparatus may determine whether there is another detected edge and region of interest to process, as described in connection with the examples in FIGS. 2 to 10. For example, the edge handling component 640 may be configured to determine whether there is another detected edge and region of interest to process. If, at 1510, the apparatus determines that there is another detected edge and region of interest to process, control returns to 1504 to determine whether the detected edge overlaps with a region of interest.

If, at 1510, the apparatus determines that there is not another detected edge and region of interest to process, then, at 1512, the apparatus may apply the pixel configurations, as described in connection with the examples in FIGS. 2 to 10. For example, the processing unit 220 and/or the image processor 600 may be configured to apply the pixel configurations to the configurable pixels of the image sensor.

The subject matter described herein can be implemented to realize one or more benefits or advantages. For instance, the described image processing techniques can be used by an application processor (e.g., an ISP, a CPU, a GPU, a display processor, a DPU, a video processor, or some other processor that can perform image processing) to implement the employing of a PDAF optical system including pixels that may be configured to operate as focus pixels or imaging pixels to improve PDAF processing, reduce the likelihood of less beneficial information for PDAF purposes being transmitted, reduce the load of a processing unit (e.g., any processing unit configured to perform one or more techniques disclosed herein, such as an image processor), and/or reduce power consumption of the processing unit.

In accordance with this disclosure, the term "or" may be interrupted as "and/or" where context does not dictate otherwise. Additionally, while phrases such as "one or more" or "at least one" or the like may have been used for some features disclosed herein but not others, the features for which such language was not used may be interpreted to have such a meaning implied where context does not dictate otherwise.

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium. Computer-readable media may include computer data storage media or communication media including any medium that facilitates transfer of a computer program from one place to another. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. By way of example, and not limitation, such computer-readable media can comprise RAM, ROM, EEPROM, CD-ROM or other optical disk storage, magnetic disk storage or other magnetic storage devices. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. A computer program product may include a computer-readable medium.

The code may be executed by one or more processors, such as one or more digital signal processors (DSPs), general purpose microprocessors, application specific integrated circuits (ASICs), arithmetic logic units (ALUs), field programmable logic arrays (FPGAs), or other equivalent integrated or discrete logic circuitry. Accordingly, the term "processor," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs, e.g., a chip set. Various components, modules or units are described in this disclosure to emphasize functional aspects of devices configured to perform the disclosed techniques, but do not necessarily need realization by different hardware units. Rather, as described above, various units may be combined in any hardware unit or provided by a collection of interoperative hardware units, including one or more processors as described above, in conjunction with suitable software and/or firmware.

The following examples are illustrative only and may be combined with aspects of other embodiments or teachings described herein, without limitation.

Example 1 is an apparatus comprising: an image sensor comprising a plurality of pixels, the plurality of pixels including a set of pixels configurable to be imaging pixels or focus pixels, the image sensor configured to generate image data of a scene based on received light at the plurality of pixels; and a processor coupled to the image sensor and configured to: receive first image data of a first frame of the scene; determine at least one region of interest or region of non-interest of the first frame; select, based on the determined at least one region of interest or region of non-interest, a subset of the set of pixels to be focus pixels; and cause the selected subset of the set of pixels to operate as focus pixels.

In Example 2, the apparatus of Example 1 further includes that the processor is further configured to: receive, from the image sensor, second image data of a second frame, the second image data including focus data from the selected subset of the set of pixels and imaging data from the remaining pixels of the plurality of pixels.

In Example 3, the apparatus of any of Example 1 or Example 2 further includes a lens assembly configured to focus the received light on the image sensor, wherein the processor is configured to shift the lens assembly to adjust the focus of the received light on the image sensor based on the second image data.

In Example 4, the apparatus of any of Examples 1 to 3 further includes that the processor is configured to select the subset of the set of pixels to be focus pixels based on a determined region of interest by: increasing a density of focus pixels associated with the determined region of interest from a first density of focus pixels associated with the determined region of interest when the first image data is received to a second density of focus pixels.

In Example 5, the apparatus of any of Examples 1 to 4 further includes that the processor is configured to determine a density of focus pixels associated with the determined region of interest based on a target item identified in the determined region of interest.

In Example 6, the apparatus of any of Examples 1 to 5 further includes that the determined region of interest or region of non-interest includes a first region of interest and a second region of interest, and wherein the processor is configured to select a first density of focus pixels associated with the first region of interest and to select a second density of focus pixels associated with the second region of interest, the second density being different than the first density.

In Example 7, the apparatus of any of Examples 1 to 6 further includes that the processor is configured to select the subset of the set of pixels to be focus pixels based on a determined region of non-interest by: decreasing a density of focus pixels associated with the determined region of non-interest from a first density of focus pixels associated with the determined region of non-interest when the first image data is received to a second density of focus pixels.

In Example 8, the apparatus of any of Examples 1 to 7 further includes that the processor is configured to cause pixels in the set of pixels associated with the determined region of non-interest to operate as imaging pixels.

In Example 9, the apparatus of any of Examples 1 to 8 further includes that the processor is configured to cause the selected subset of the set of pixels to operate as focus pixels by: setting a first focus orientation for each of the pixels of the selected subset of the set of pixels based on at least one texture or edge detected within the first frame.

In Example 10, the apparatus of any of Examples 1 to 9 further includes that the processor is further configured to: determine whether a confidence level of focus for second image data received from the image sensor of a second frame satisfies a confidence threshold; and set a second focus orientation for each of the pixels of the selected subset of the set of pixels when the confidence level of focus does not satisfy the confidence threshold, the second focus orientation being different than the first focus orientation.

In Example 11, the apparatus of any of Examples 1 to 10 further includes that the first focus orientation is one of an up-down orientation, a left-right orientation, or a diagonal orientation.

In Example 12, the apparatus of any of Examples 1 to 11 further includes that the determined region of interest or region of non-interest includes a first region of interest and a second region of interest, wherein the first region of interest and the second region of interest are determined based on a level of light associated with each respective region of interest, and wherein the first region of interest is associated with a relatively lower level of light with respect to the second region of interest, and wherein the processor is further configured to: receive second image data of a second frame of the scene, the second image data including the same first region of interest and the same second region of interest as the first frame; average data of a first subset of focus pixels associated with the first region of interest; average data of a second subset of focus pixels associated with the second region of interest; and shift a lens assembly to adjust the focus of the received light on the image sensor based on the average of the data of the first subset of focus pixels and the average of the data of the second subset of focus pixels.

In Example 13, the apparatus of any of Examples 1 to 12 further includes that the processor is further configured to determine the first region of interest and the second region of interest based on edge detection associated with the determined region of interest or region of non-interest.

In Example 14, the apparatus of any of Examples 1 to 13 further includes that the processor is further configured to: increase a density of focus pixels associated with the first region of interest; and increase a density of focus pixels associated with the second region of interest.

In Example 15, the apparatus of any of Examples 1 to 14 further includes that the processor is further configured to: receive information indicating the at least one region of interest or region of non-interest of the first frame, and wherein the processor is configured to determine the at least one region of interest or region of non-interest based on the received information.

In Example 16, the apparatus of any of Examples 1 to 15 further includes that each pixel of the set of pixels includes: a photodiode; and an opacity transitioning material positioned above the photodiode, the opacity transitioning material including a first opacity transitioning material portion arranged above a first section of the photodiode and a second opacity transitioning material portion arranged above a second section of the photodiode, the first opacity transitioning material portion and the second opacity transitioning material portion being independently configurable to be opaque or transparent.

In Example 17, the apparatus of any of Examples 1 to 16 further includes that each pixel of the set of pixels is configured to operate as a focus pixel when one of the first opacity transitioning material portion or the second opacity transitioning material portion is opaque and the other of the first opacity transitioning material portion or the second opacity transitioning material portion is transparent, and the pixel is configured to operate as an imaging pixel when both of the first opacity transitioning material portion and the second opacity transitioning material portion are transparent.

In Example 18, the apparatus of any of Examples 1 to 17 further includes that the opacity transitioning material further includes a third opacity transitioning material portion arranged above a third section of the photodiode and a fourth opacity transitioning material portion arranged above a fourth section of the photodiode, the first opacity transitioning material portion, the second opacity transitioning material portion, the third opacity transitioning material portion, and the fourth opacity transitioning material portion being independently configurable to be opaque or transparent.

In Example 19, the apparatus of any of Examples 1 to 18 further includes that the processor is further configured to set a focus orientation for each of the focus pixels by configuring each of the first opacity transitioning material portion, the second opacity transitioning material portion, the third opacity transitioning material portion, and the fourth opacity transitioning material portion to be independently opaque or transparent.

In Example 20, the apparatus of any of Examples 1 to 19 further includes that the focus orientation is one of six different focus orientations, and wherein each of the six different focus orientations comprises setting two of the opacity transitioning material portions to be opaque and setting the remaining two opacity transitioning material portions to be transparent.

Example 21 is a device including one or more processors and one or more memories in electronic communication with the one or more processors storing instructions executable by the one or more processors to cause a system or an apparatus to implement a method as in any of Examples 1 to 20.

Example 22 is a system or apparatus including means for implementing a method or realizing an apparatus as in any of Examples 1 to 20.

Example 23 is a non-transitory computer-readable medium storing instructions executable by one or more processors to cause the one or more processors to implement a method as in any of Examples 1 to 20.

Various examples have been described. These and other examples are within the scope of the following claims.

What is claimed is:

1. An apparatus, comprising:
    an image sensor comprising a plurality of pixels, the plurality of pixels including a set of pixels each of which is configurable to switch between operation as an imaging pixel or as a focus pixel, the image sensor configured to generate image data of a scene based on received light at the plurality of pixels,
    at least one photodiode associated with each of the set of pixels; and an opacity transitioning material positioned above the at least one photodiode, the opacity transitioning material including a first opacity transitioning material portion arranged above a first section of the at least one photodiode, a second opacity transitioning material portion arranged above a second section of the at least one photodiode, a third opacity transitioning material portion arranged above a third section of the at least one photodiode, and a fourth opacity transitioning material portion arranged above a fourth section of the at least one photodiode, the first opacity transitioning material portion, the second opacity transitioning material portion, the third opacity transitioning material portion, and the fourth opacity transitioning material portion each being independently configurable to be opaque or transparent, wherein each pixel of the set of pixels is configured to operate as the focus pixel when one of the first opacity transitioning material portion or the second opacity transitioning material portion is opaque and another of the first opacity transitioning material portion or the second opacity transitioning material portion is transparent, and the pixel is configured to operate as the imaging pixel when both of the first opacity transitioning material portion and the second opacity transitioning material portion are transparent.

2. The apparatus of claim 1, further comprising:
at least one processor coupled to the image sensor and configured to:
  set a focus orientation for each of the focus pixels by configuring each of the first opacity transitioning material portion, the second opacity transitioning material portion, the third opacity transitioning material portion, and the fourth opacity transitioning material portion to be independently opaque or transparent.

3. The apparatus of claim 2, wherein the focus orientation is one of six different focus orientations, and wherein each of the six different focus orientations comprises setting two of the opacity transitioning material portions to be opaque and setting remaining two opacity transitioning material portions to be transparent.

4. The apparatus of claim 1, further comprising:
at least one processor coupled to the image sensor and configured to:
  receive first image data of a first frame of the scene;
  determine at least one region of interest or region of non-interest of the first frame;
  select, based on the determined at least one region of interest or region of non-interest, a subset of the set of pixels to operate as focus pixels; and
  cause the selected subset of the set of pixels to operate as focus pixels.

5. The apparatus of claim 4, wherein the at least one processor is further configured to:
  receive, from the image sensor, second image data of a second frame, the second image data including focus data from the selected subset of the set of pixels and imaging data from remaining pixels of the plurality of pixels.

6. The apparatus of claim 5, further comprising:
a lens assembly configured to focus the received light on the image sensor,
wherein the at least one processor is configured to shift the lens assembly to adjust the focus of the received light on the image sensor based on the second image data.

7. The apparatus of claim 4, wherein the at least one processor is configured to select the subset of the set of pixels to operate as focus pixels based on a determined region of interest by:
  increasing a density of focus pixels associated with the determined region of interest from a first density of focus pixels associated with the determined region of interest of the received first image data to a second density of focus pixels.

8. The apparatus of claim 7, wherein the at least one processor is configured to determine the density of focus pixels associated with the determined region of interest based on a target item identified in the determined region of interest.

9. The apparatus of claim 4, wherein the determined region of interest or region of non-interest includes a first region of interest and a second region of interest, and
  wherein the at least one processor is configured to select a first density of focus pixels associated with the first region of interest and to select a second density of focus pixels associated with the second region of interest, the second density being different than the first density.

10. The apparatus of claim 4, wherein the at least one processor is configured to select the subset of the set of pixels to operate as focus pixels based on a determined region of non-interest by:
  decreasing a density of focus pixels associated with the determined region of non-interest from a first density of focus pixels associated with the determined region of non-interest of the received first image data to a second density of focus pixels.

11. The apparatus of claim 10, wherein the at least one processor is configured to cause pixels in the set of pixels associated with the determined region of non-interest to operate as imaging pixels.

12. The apparatus of claim 4, wherein the at least one processor is configured to cause the selected subset of the set of pixels to operate as focus pixels by:
  setting a first focus orientation for each of the pixels of the selected subset of the set of pixels based on at least one texture or edge detected within the first frame.

13. The apparatus of claim 12, wherein the at least one processor is further configured to:
  determine whether a confidence level of focus for second image data received from the image sensor of a second frame satisfies a confidence threshold; and
  set a second focus orientation for each of the pixels of the selected subset of the set of pixels when the confidence level of focus does not satisfy the confidence threshold, the second focus orientation being different than the first focus orientation.

14. The apparatus of claim 12, wherein the first focus orientation is one of an up-down orientation, a left-right orientation, or a diagonal orientation.

15. The apparatus of claim 4, wherein the determined region of interest or region of non-interest includes a first region of interest and a second region of interest, wherein the first region of interest and the second region of interest are determined based on a level of light associated with each respective region of interest, and wherein the first region of interest is associated with a relatively lower level of light with respect to the second region of interest, and wherein the at least one processor is further configured to:
  receive second image data of a second frame of the scene, the second image data including a same first region of interest and a same second region of interest as the first frame;

average data of a first subset of focus pixels associated with the first region of interest;
average data of a second subset of focus pixels associated with the second region of interest; and
shift a lens assembly to adjust the focus of the received light on the image sensor based on the average of the data of the first subset of focus pixels and the average of the data of the second subset of focus pixels.

16. The apparatus of claim 15, wherein the at least one processor is further configured to determine the first region of interest and the second region of interest based on edge detection associated with the determined region of interest or region of non-interest.

17. The apparatus of claim 15, wherein the at least one processor is further configured to:
increase first density of focus pixels associated with the first region of interest; and
increase second density of focus pixels associated with the second region of interest.

18. The apparatus of claim 4, wherein the at least one processor is further configured to:
receive information indicating the at least one region of interest or region of non-interest of the first frame, and
wherein the at least one processor is configured to determine the at least one region of interest or region of non-interest based on the received information.

19. A method of operation at an image sensor, comprising:
receiving light at a plurality of pixels of the image sensor, the plurality of pixels including a set of pixels each of which is configurable to switch between operation as an imaging pixel or as a focus pixel, the image sensor configured to generate image data of a scene based on the received light at the plurality of pixels; and
configuring each pixel of the set of pixels as the focus pixel or as the imaging pixel, wherein the pixel is associated with at least one photodiode, an opacity transitioning material is positioned above the at least one photodiode, the opacity transitioning material including a first opacity transitioning material portion arranged above a first section of the at least one photodiode, a second opacity transitioning material portion arranged above a second section of the at least one photodiode, a third opacity transitioning material portion arranged above a third section of the at least one photodiode, and a fourth opacity transitioning material portion arranged above a fourth section of the at least one photodiode, the first opacity transitioning material portion, the second opacity transitioning material portion, the third opacity transitioning material portion, and the fourth opacity transitioning material portion each being independently configurable to be opaque or transparent, and
the pixel is configured to operate as the focus pixel when one of the first opacity transitioning material portion or the second opacity transitioning material portion is opaque and another of the first opacity transitioning material portion or the second opacity transitioning material portion is transparent, and the pixel is configured to operate as the imaging pixel when both of the first opacity transitioning material portion and the second opacity transitioning material portion are transparent.

* * * * *